(12) United States Patent
Yudasaka

(10) Patent No.: US 7,141,492 B2
(45) Date of Patent: Nov. 28, 2006

(54) METHOD FOR FORMING THIN-FILM, APPARATUS FOR FORMING THIN-FILM, METHOD FOR MANUFACTURING SEMICONDUCTOR DEVICE, ELECTRO-OPTICAL UNIT, AND ELECTRONIC APPARATUS

(75) Inventor: Ichio Yudasaka, Fujimi-machi (JP)

(73) Assignee: Seiko Epson Corporation, Tokyo (JP)

(*) Notice: Subject to any disclaimer, the term of this patent is extended or adjusted under 35 U.S.C. 154(b) by 221 days.

(21) Appl. No.: 10/419,123

(22) Filed: Apr. 21, 2003

(65) Prior Publication Data

US 2004/0087068 A1   May 6, 2004

(30) Foreign Application Priority Data

| Apr. 22, 2002 | (JP) | ............................. 2002-119849 |
| Dec. 12, 2002 | (JP) | ............................. 2002-361012 |
| Apr. 11, 2003 | (JP) | ............................. 2003-107693 |

(51) Int. Cl.
    *H01L 21/20* (2006.01)

(52) U.S. Cl. ..................... 438/497; 438/790; 438/782; 438/502; 257/E21.479; 257/E21.174; 257/E21.114

(58) Field of Classification Search ................ 438/488, 438/502, 492, 493, 497, 500, 782, 908, 149, 438/496, 498, 907, 909, 790; 217/54; 218/66; 257/E21.479, E21.174, E21.114
See application file for complete search history.

(56) References Cited

U.S. PATENT DOCUMENTS 5,134,962 A * 8/1992 Amada et al. ............. 118/688

| 5,866,471 A | * | 2/1999 | Beppu et al. | ............... 438/502 |
| 2001/0014544 A1 | * | 8/2001 | Tanaka et al. | ............. 438/905 |
| 2002/0076882 A1 | * | 6/2002 | Iwane et al. | ............... 438/256 |
| 2003/0045131 A1 | * | 3/2003 | Verbeke et al. | ............ 438/795 |

FOREIGN PATENT DOCUMENTS

| JP | A-5-154430 | 6/1993 |
| JP | A-8-83762 | 3/1996 |
| JP | A-9-10657 | 1/1997 |
| JP | A-9-213693 | 8/1997 |
| JP | A-11-262720 | 9/1999 |

* cited by examiner

Primary Examiner—George Fourson
Assistant Examiner—Julio J. Maldonado
(74) Attorney, Agent, or Firm—Oliff & Berridge, PLC

(57) ABSTRACT

The invention provides a method of forming a high-performance thin-film at low cost using a liquid material in safety, an apparatus to form a thin-film, a method of manufacturing a semiconductor device, an electro-optical unit, and an electronic apparatus.

An apparatus to form a thin-film includes a coating unit to apply a liquid material containing a thin-film component onto a substrate and also includes heat-treating units to heat the substrate applied with the liquid material. The coating unit and the heat-treating units each include a control device to control the atmosphere in a treating chamber to treat the substrate.

11 Claims, 13 Drawing Sheets

(a)

(b)

(c)

METHOD FOR FORMING THIN-FILM, APPARATUS FOR FORMING THIN-FILM, METHOD FOR MANUFACTURING SEMICONDUCTOR DEVICE, ELECTRO-OPTICAL UNIT, AND ELECTRONIC APPARATUS

BACKGROUND OF THE INVENTION

1. Field of Invention

The present invention relates to a method of forming a thin-film, an apparatus to form a thin-film, a method of manufacturing a semiconductor device, an electro-optical unit, and an electronic apparatus.

2. Description of Related Art

In the related art, in general, semiconductor devices used for various electronic apparatuses include layers, such as semiconductor layers, insulating layers, and conductive layers. A CVD (Chemical Vapor Deposition) process or a sputtering process is principally used to form such insulating layers and conductive layers. A thermal CVD process, a plasma-CVD process, a photo-CVD process, or the like using a monosilane gas or a disilane gas is used to form a silicon layer, which is one of such semiconductor layers.

In the related art CVD and sputtering processes, there is a problem in that an apparatus to form a thin-film is expensive and large because a high-precision vacuum unit and a power-supply unit to generate plasma and so on are necessary. In order to address or solve the above problem, other related art methods, which are different from the above related art methods of forming the thin-films, can be used.

For example, the related art includes a method of forming a desired thin-film by applying a liquid material onto a substrate to form a coating and then heat-treating the coating. The thin-film forming method includes: applying the liquid material onto a surface of the substrate, and heat-treating the coated surface. According to this method, thin-films can be formed with an inexpensive compact apparatus at high productivity and low cost, thereby manufacturing thin-film devices at low cost.

In the applying step, a coating process, such as a spin-coating process or a droplet-ejecting process (a so-called inkjet process) is usually used. The related art includes the following exemplary device, apparatus, etc., for the spin-coating process: a spinner having a cover that can be readily detached when a treating solution is changed (see, for example, Japanese Unexamined Patent Application Publication No. 5-154430), a coating apparatus in which coating liquid can be applied onto a treating substrate while a cover of a rotating container is closed (see, for example, Japanese Unexamined Patent Application Publication No. 8-83762), and so on. For the inkjet process, the related art includes the following apparatus, etc.: an apparatus to form a uniform coating on a treating substrate in such a manner that the treating substrate and an inkjet head are rotated relative to each other while the angular speed and the moving speed are controlled, the inkjet head moves between a region close to the axis of rotation and a region far from the axis, and liquid is ejected from micro-nozzles of the inkjet head toward the treating substrate (see, for example, Japanese Unexamined Patent Application Publication No. 9-10657) and so on.

For the heat-treating, the related art includes the following process, etc.: a process of firing an insulating coating in a firing furnace in which the oxygen content is adjusted to a certain value or less (see, for example, Japanese Unexamined Patent Application Publication No. 9-213693) and so on. Furthermore, for the sequential steps including the applying and the heat-treating, for example, the related art includes the following method of forming a coating: coating liquid is dropped on a surface of a treating material; the resulting coating liquid is uniformly spread over the treating material surface; the resulting treating material, in which a part of the coating liquid for forming a coating is disposed at the periphery of the lower surface of the treating material, is transported to a vacuum drying apparatus; the treating material is dried to a certain degree; and the resulting treating material is then heated and dried (see, for example, Japanese Unexamined Patent Application Publication No. 11-262720).

SUMMARY OF THE INVENTION

Although a thin-film forming apparatus to continuously perform coating and heat-treating and various coating units and heat-treating units used in processing steps have been proposed, as described in the above related art, further enhancements are necessary in order that the performance of the coating units and heat-treating units is enhanced, the size and manufacturing cost thereof are reduced, thereby the performance of the whole of the thin-film forming apparatus is enhanced and the size and manufacturing cost thereof are reduced.

Furthermore, in a liquid material to form a coating, there is a problem in safety. For example, the liquid material is flammable because the liquid material usually contains an organic solvent. Therefore, components of thin-film forming apparatuses include metal materials as much as possible, at least a chamber in which coating is performed does not include plastic and so on, and in addition such apparatuses include a device to remove organic solvent vapor. However, there is a problem in that the liquid material cannot be substantially used in related art thin-film forming apparatuses in case it may be particularly necessary to pay attention to safety, because, the liquid material may generate toxic gas or be spontaneously flammable under the presence of oxygen.

The present invention addresses or solves the above and/or other problems, and provides a method of forming a thin-film, an apparatus to form a thin-film, a method of manufacturing a semiconductor device, an electro-optical unit, and an electronic apparatus in which the apparatus maintenance can be efficiently performed, the apparatus performance can be enhanced, the manufacturing cost of products can be reduced by the enhancement of the performance, and furthermore safety can be ensured.

In order to address or solve the above, a method of forming a thin-film according to the present invention includes a coating step of applying a liquid material containing a thin-film component onto a substrate, and a heat-treating step of heat-treating the substrate. A treating atmosphere used in each step is independently controlled.

According to the thin-film forming method, since a treating atmosphere of each step is independently controlled, the treating atmosphere of each step can be selected from the group including an oxidative gas, such as oxygen, a reductive gas, such as hydrogen, and an inert gas, such as nitrogen, thereby obtaining an atmosphere fit for each step.

For example, the following procedure can be performed: oxidative gas is fed, ultraviolet rays are applied to the gas to produce ozone, and organic impurities are then decomposed using the ozone, thereby making the substrate surface lyophilic. When a surface-treated substrate is transported to another treating chamber, oxidative gas can be substantially prevented or prevented from entering another treating chamber by introducing inert gas. In order to enhance the layer properties, reductive gas may be used instead of the inert gas.

The thin-film forming method preferably includes a pre-treating step of cleaning the substrate surface before the coating step. A treating atmosphere used in the pre-treating step is preferably controlled in an independent way.

According to the above method, the treating atmosphere of the pre-treating step can be appropriately controlled and thus an atmosphere fit for the pre-treating step can be employed.

In the thin-film forming method, the thin-film is preferably at least one of a conductive layer, an insulating layer, and a semiconductor layer.

According to the above method, since at least one of the conductive layer, the insulating layer, and the semiconductor layer can be formed, thin-film devices having a thin-film multilayer structure including the thin-film can be formed, when this method includes a plurality of steps of applying the liquid material.

In the thin-film forming method, the thin-film is preferably a conductive layer or a semiconductor layer, and the coating step and the heat-treating step are preferably performed in such a manner that the content of oxygen or oxidative gas in the treating atmosphere of each step is controlled to 10 ppm or less.

According to the above method, oxygen contained in the treating atmosphere can be substantially prevented or prevented from penetrating the conductive layer or the semiconductor layer during the formation, thereby reducing or preventing the conductivity of the obtained thin-film and the electric properties of the semiconductor layer from being deteriorated.

The thin-film forming method preferably further includes a cleaning step of cleaning a liquid feeding system in which the liquid material remains.

According to the above method, since the liquid feeding system can be cleaned in the cleaning step after the completion of the coating step, the liquid material can be efficiently removed and thereby the change of the liquid material and the maintenance of the apparatus can be safely performed even if the liquid material is toxic or spontaneously flammable under the presence of oxygen.

In the thin-film forming method, the coating step preferably includes a waste liquid-storing sub-step of storing waste liquid left over after the liquid material is applied onto the substrate.

According to the above method, since the waste liquid remaining in a coating chamber can be recovered after the application of the liquid material, another liquid material can be applied without the adverse effect of the former liquid material. When a waste liquid-storing section contains a deactivator to deactivate the liquid material having flammability and toxicity, the waste liquid can be safely handled.

The thin-film forming method preferably further includes a waste liquid-deactivating step of deactivating the waste liquid stored in the waste liquid-storing sub-step.

According to the above method, the waste liquid can be safely handled by deactivating the liquid material having flammability and toxicity.

In the thin-film forming method, the heat-treating step may include a first heat-treating sub-step of heating the substrate and a second heat-treating sub-step of heating the resulting substrate at a temperature higher than the temperature of the first heat-treating sub-step.

According to the above method, the substrate can be efficiently heat-treated according to the use. That is, since the liquid material usually contains an organic solvent and heat-treating conditions to remove the organic solvent are different from heat-treating conditions for converting a coating into a thin-film having a specific function, optimum conditions can be set by adjusting the heat-treating conditions to arbitrary values.

In the thin-film forming method, the heat-treating step may include a first heat-treating sub-step of heating the substrate, a second heat-treating sub-step of heating the resulting substrate at a temperature higher than the temperature of the first heat-treating sub-step, and a third heat-treating sub-step of heating the resulting substrate at a temperature higher than the temperature of the second heat-treating sub-step.

According to the above method, the substrate can be efficiently heat-treated according to the use. That is, optimum heat-treating conditions can be set in heat-treating steps and thereby a high-quality thin-film can be formed, when the following heat-treating steps are necessary in order to form such a thin-film from the liquid material: a heat-treating step of removing the organic solvent contained in the liquid material, a heat-treating step of converting a liquid coating into the functional thin-film by firing, a heat-treating step of enhancing the properties and the crystallinity of the obtained thin-film.

An apparatus to form a thin-film includes a coating unit to apply a liquid material containing a thin-film component onto a substrate and a heat-treating unit to heat-treat the substrate coated with the liquid material. The coating unit and the heat-treating unit each include a control device to independently control the atmosphere in each treating chamber to treat the substrate.

Since this thin-film forming apparatus includes the control device for each to independently control the atmosphere in each treating chamber to perform treatment, the atmosphere in each treating chamber is controlled with the controlling device to select the treating atmosphere in each chamber from the group including oxidative gas, such as oxygen, reductive gas such as hydrogen, and inert gas such as nitrogen, thereby obtaining an atmosphere fit for treatment.

For example, when a conductive layer or a semiconductor layer is heat-treated, such an inert gas atmosphere is necessary in order to reduce or prevent the layer deterioration caused by oxidation. In order to remove oxygen contained in the obtained thin-film, a heat-treating chamber preferably has such a reductive atmosphere. When the content of oxygen contained in the obtained thin-film is increased and the thin-film is converted into an oxide by firing, heat treatment is preferably performed in such an oxidative atmosphere. According to the above configuration, optimum treating conditions can be set in order to enhance the layer properties.

The thin-film forming apparatus further preferably includes a pre-treating unit to clean the substrate surface. The pre-treating unit preferably includes a control device to independently control the atmosphere in a treating chamber to treat the substrate.

According to the above configuration, for the pre-treating unit, the atmosphere in the treating chamber can be appropriately controlled and thus the atmosphere can be appropriately selected depending on treatment.

For example, the following procedure can be performed: oxidative gas is fed to the pre-treating unit, ultraviolet rays are applied to the gas to produce ozone, and organic impurities are then decomposed using the ozone, thereby making the substrate surface lyophilic. When a surface-treated substrate is transported to another treating chamber, oxidative gas can be substantially prevented or prevented from entering another treating chamber by introducing inert gas.

The thin-film forming apparatus preferably further includes a connection chamber communicatively connected to each treating chamber of the corresponding unit. The connection chamber preferably includes a control device to independently control the atmosphere in the connection chamber.

According to the above configuration, a substrate is not exposed to outside air but can be kept in a desired atmosphere and thus oxidation caused by oxygen in air can be reduced or prevented, if the substrate is placed in the connection chamber and the atmosphere of the connection chamber is controlled in advance with the control device when the substrate is transported from a treating chamber of each unit to another treating chamber or temporarily stored. Since the treating chambers are connected to each other via the connection chamber, the atmosphere in one treating chamber can be substantially prevented or prevented from exerting an influence upon the atmosphere in another treating chamber.

In the thin-film forming apparatus, each control device preferably controls the content of oxygen or oxidative gas in the corresponding treating chamber to 10 ppm or less.

According to the above configuration, when the thin-film to be formed is a conductive layer or a semiconductor layer, oxygen in the treating atmosphere can be substantially prevented or prevented from penetrating the conductive layer or the semiconductor layer, thereby substantially preventing or preventing the conductive layer and the semiconductor layer to be formed from being deteriorated.

In the thin-film forming apparatus, the coating unit preferably includes a nozzle to apply the liquid material and a liquid-feeding system having a container, connected to the nozzle, to store the liquid material, and the liquid-feeding system preferably includes a cleaning device to clean the liquid-feeding system.

According to the above configuration, since the liquid-feeding system can be cleaned with the cleaning device after the application of the liquid material, thin-films having substantially no defect can be formed. Furthermore, the liquid material can be efficiently removed and thereby safety can be maintained if the liquid material is toxic or spontaneously flammable under the presence of oxygen.

In the thin-film forming apparatus, the cleaning solution may contain a deactivator to deactivate the liquid material.

According to the above configuration, even if the liquid material contains a substance harmful to humans and remains in the liquid-feeding system, the liquid material can be efficiently rendered harmless with the deactivator. Furthermore, even if the liquid material is spontaneously flammable in air, the flammability can be reduced with the deactivator and thereby the change of a container containing the liquid material and the maintenance of the apparatus can be safely performed.

In the thin-film forming apparatus, the coating unit preferably includes a waste liquid-storing device to store waste liquid left over after the application of the liquid material.

According to the above configuration, since the remaining waste liquid can be recovered with the waste liquid-storing device after the application of the liquid material, another liquid material can be satisfactorily applied without the adverse effect of the former liquid material.

In the present invention, a method of manufacturing a semiconductor device having functional layers, any one of the functional layers being formed by applying a liquid material containing a component of the functional layer onto a substrate, includes: forming a functional layer by the above-mentioned thin-film forming method or using the above-mentioned thin-film forming apparatus.

According to this semiconductor device-manufacturing method, thin-films having desired properties can be formed and thereby high-performance semiconductor devices can be manufactured.

An electro-optical unit of the present invention includes a semiconductor device manufactured by the above-mentioned semiconductor device-manufacturing method.

Since this electro-optical unit includes such a semiconductor device, manufactured at low cost, having high-performance, the electro-optical unit itself can also be manufactured at low cost and has high-performance. The term "electro-optical unit" is herein defined as general equipment including an electro-optical element that emits light with electric power or modulates light propagated from the outside, and this term means both an equipment emitting light by itself and an equipment controlling light propagated from the outside. The electro-optical unit includes, for example, liquid crystal elements, electrophoretic elements, EL (electroluminescence) elements, and electron-emitting elements in which electrons generated by the application of electric field are applied to a luminescent plate to emit light.

An electronic apparatus of the present invention includes a semiconductor device manufactured by the above-mentioned semiconductor device-manufacturing method or the above-mentioned electro-optical unit.

Since this electronic apparatus includes such a semiconductor device, manufactured at low cost, having high-performance, the electronic apparatus itself can also be manufactured at low cost and has high-performance. The term "electronic apparatus" is herein defined as a general apparatus includes combination of a plurality of elements and circuits and having a certain function, and such an apparatus includes, for example, the electro-optical unit and a memory. This electronic apparatus may comprise one or more circuit boards. The electronic apparatus is not limited to such a configuration and includes IC cards, mobile phones, video cameras, personal computers, head-mounted displays, rear or front-mounted projectors, fax machines having a display function, digital camera finders, mobile TVs, DSPs, PDAs, electronic notebooks, electric signs, and displays for advertisement.

DETAILED DESCRIPTION OF PREFERRED EMBODIMENTS

A method of forming a thin-film, apparatus to form a thin-film, method of manufacturing a semiconductor device, electro-optical unit, and electronic apparatus according to the present invention are described below with reference to the accompanying drawings.

First Exemplary Embodiment

[Thin-film Forming Apparatus]

Figure 1:
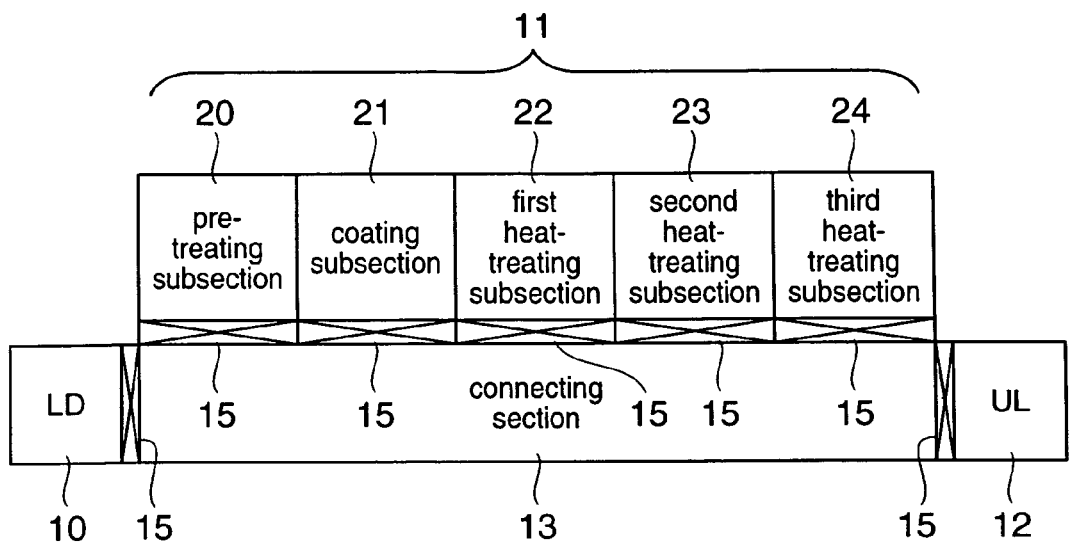
FIG. 1 is a schematic showing a thin-film forming apparatus according to a first exemplary embodiment.

FIG. 1 shows a first exemplary embodiment of a thin-film forming apparatus of the present invention. This thin-film forming apparatus may perform a thin-film forming method of the present invention. The apparatus includes a loader (LD) 10 to introduce a substrate to form a thin-film; a treating section 11 in which various thin-film forming steps are performed for the substrate introduced with the loader 10; an unloader (UL) 12 to store the substrate having the thin-film formed in the treating section 11; a connecting section 13, connected to the loader 10, the treating section 11, and the unloader 12, to transport the substrate. The unloader 12 and treating chambers each provided to the loader 10 and the treating section 11 are communicatively connected to the connecting section 13 via corresponding gate valves 15.

The treating section 11 includes a pre-treating subsection (pre-treating unit) 20 to perform a pre-treating step before a liquid material is applied onto the substrate; a coating subsection (coating unit) 21 to apply the liquid material onto the substrate by, for example, a spin-coating process in a coating step of applying the liquid material onto the substrate; a first heat-treating subsection 22 to remove a solvent contained in the coating on the substrate to solidify the coating in a heat-treating step of heat-treating the substrate; a second heat-treating subsection 23 to heat-treat the substrate coated with the liquid material and to fire the coating to form a functional thin-film; and a third heat-treating subsection 24 to perform a heat-treatment at a temperature higher than the temperature of the second heat-treating subsection 23 to enhance the properties of the thin-film. In this exemplary embodiment, a heat-treating unit of the present invention includes the first heat-treating subsection 22, the second heat-treating subsection 23, and the third heat-treating subsection 24.

Treating chambers having the corresponding subsections, that is, the pre-treating subsection (pre-treating unit) 20, the coating subsection (coating unit) 21, the first heat-treating subsection 22, the second heat-treating subsection 23, and the third heat-treating subsection 24, and also the connecting section (connection chamber) 13 each have a control device including an evacuator or vacuum unit (not shown) and a unit to introduce various gases (oxidative gas, reductive gas, and inert gas), as described below. Thereby, in the atmosphere in each treating chamber, that is, in the atmosphere of each step, the gas species and the pressure can be independently controlled.

In the pre-treating subsection 20, a substrate pre-treating step including a sub-step of cleaning the substrate surface and/or a surface-treating sub-step of appropriately modulating the lyophilicity (or lyophobicity) of the substrate surface is performed. In the pre-treating step, any one of the following processes is used: a process in which ultraviolet rays are applied to a surface of a substrate to generate ozone around the substrate to perform surface treatment, another process in which atmospheric pressure plasma is generated to perform the surface-treatment of a substrate, and so on.

Figure 2:
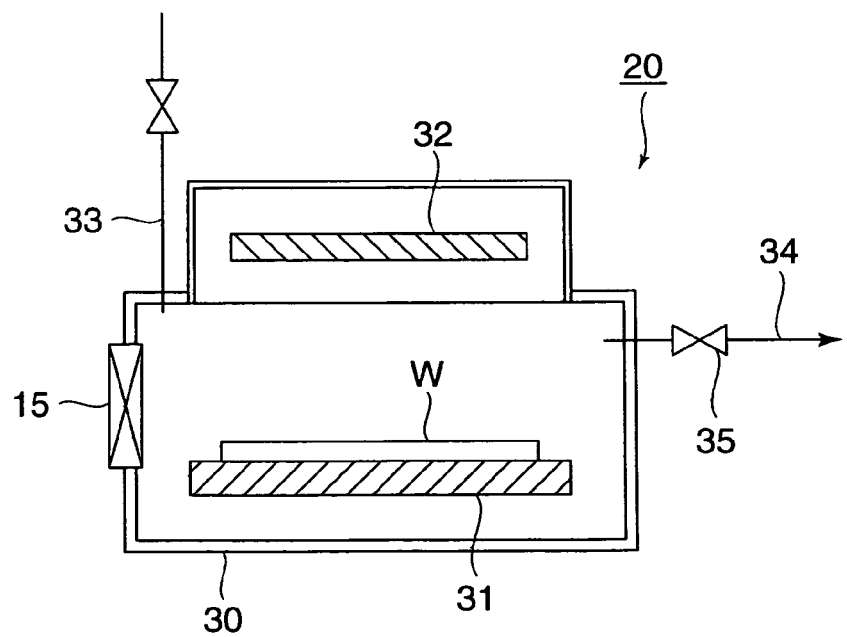
FIG. 2 is a schematic showing a pre-treating subsection.

FIG. 2 is a schematic of the pre-treating subsection 20 to perform surface-treatment by applying ultraviolet rays.

The pre-treating subsection 20 is connected to the connecting section 13 via one of the gate valves 15 and includes a chamber (treating chamber) 30 that can be kept airtight; a substrate stage 31, equipped with a heating device (not shown), to support a substrate W; a UV lamp 32 to apply ultraviolet rays toward the inside of the chamber 30; a feeding system 33 to feed various atmosphere gases to the chamber 30; and an evacuation system 34 to evacuate the chamber 30. The feeding system 33 to feed the various atmosphere gases to the chamber 30 and the evacuation system 34 to evacuate the chamber 30 are main components of the control device to independently control a treating atmosphere in the chamber of the pre-treating subsection 20, that is, the chamber 30.

A heating device provided to the substrate stage 31 includes, for example, a heater, such as a hot plate, and functions so as to remove water adsorbed on the substrate W. The UV lamp 32 includes an excimer lamp emitting light having, for example, a wavelength of 172 nm and generates ozone by decomposing oxygen fed from the feeding system 33 using ultraviolet rays to decompose inorganic impurities lying on the substrate W, thereby making the substrate surface lyophilic. When conditions to directly apply the ultraviolet rays to the substrate surface are regulated by adjusting the distance between the excimer lamp and the substrate and/or by controlling the atmosphere in the chamber, the inorganic impurities on the substrate W can be directly decomposed. In addition to the oxygen (oxidative gas), reductive gas (for example, hydrogen or the like) and inert gas (for example, nitrogen or the like) can be fed to the chamber 30 from the feeding system 33 according to needs. The evacuation system 34 is connected to an evacuator or vacuum unit (both not shown). Thereby, the chamber 30 can be depressurized or maintained substantially at an atmospheric pressure by opening or closing a variable valve 35 depending on the flow rate of gas fed to the chamber 30.

Furthermore, when the treated substrate W is transported to another treating chamber (chamber), the evacuation system 34 functions so as to reduce or prevent oxidative gas from entering another treating chamber by evacuating the chamber 30 filled with the oxidative gas and then introducing inert gas into the chamber 30.

In this exemplary embodiment, surface treatment is performed using ultraviolet rays in the pre-treating subsection 20. However, the present invention is not limited to such a process. In the pre-treating subsection 20, the following processes may be used: a process in which ozone is generated around a substrate and ultraviolet rays are applied to the substrate surface to clean the surface and another process in which atmospheric pressure plasma is generated using oxidative gas to clean the substrate surface. According to such processes, the wettability and the adhesion during the step of applying the liquid material can be enhanced by cleaning the substrate surface. Furthermore, the processes can be used to form oxidation layers in combination with the control of the substrate temperature using a heating means, because ozone and oxygen plasma have a function of oxidizing an oxidizable layer surface.

Figure 3:
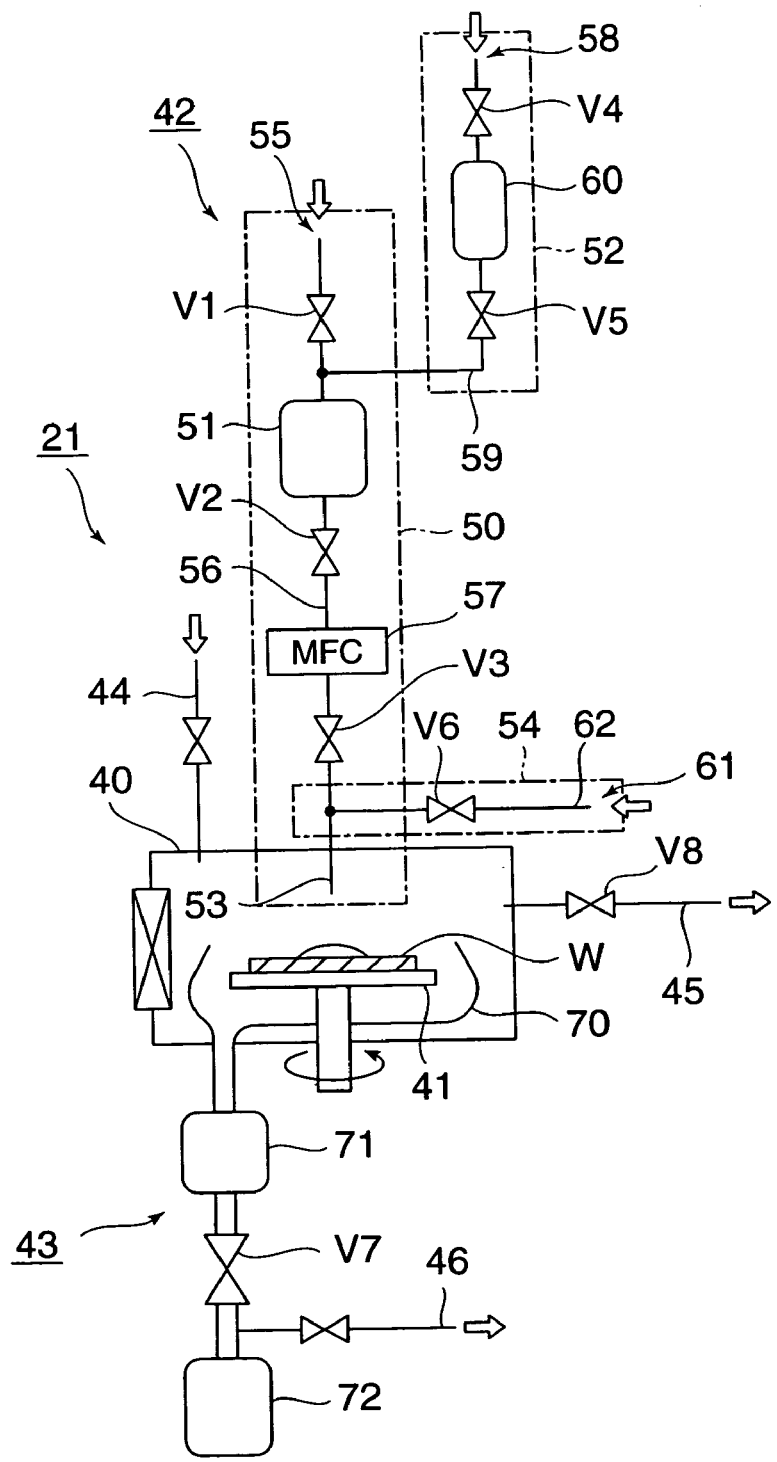
FIG. 3 is a schematic showing a spin coating unit.

FIG. 3 is a schematic of the coating subsection (coating unit) 21.

In this exemplary embodiment, the coating subsection 21, which corresponds to a coating unit, includes a spin coater. The coating subsection (coating unit) 21 is connected to the connecting section 13 via the gate valve 15 and includes a chamber (treating chamber) 40 that can be kept airtight; a substrate stage 41, equipped with a rotating device (not shown), to support the substrate W; a liquid-feeding system 42 to feed the liquid material to the substrate W; a waste liquid-treating system (waste liquid-storing means) 43 to trap the liquid material splashed by the centrifugal force due to the rotation of the substrate stage 41 and then recover the trapped liquid material, which is a waste liquid; a feeding system 44 to feed various atmosphere gases to the chamber 40; and an evacuation system 45 to evacuate the chamber 40. The feeding system 44 to feed the various atmosphere gases to the chamber 40 and the evacuation system 45 to evacuate the chamber 40 are main components of the control device to independently control a treating atmosphere of the chamber of the coating subsection 21, that is, the chamber 40.

The liquid-feeding system 42 includes a liquid-feeding line 50, a cleaning device 52 to clean a liquid container 51 provided to the liquid-feeding line 50, and a purge device 54 to prevent a nozzle 53 disposed in the liquid-feeding line 50 from being plugged.

The liquid-feeding line 50 includes a liquid container 51, disposed between a gas-introducing port 55 and a piping sub-line 56 connected to the nozzle 53 for ejecting the liquid material, to temporarily store the liquid material and then feed the liquid material to the nozzle 53; a first valve V1 and second valve V2 disposed at corresponding two connections in the piping sub-line 56 connected to the liquid container 51; a mass flow controller (hereinafter referred to as MFC) 57 to control the flow rate of the liquid material; and a third valve V3 disposed between the MFC 57 and the nozzle 53. The liquid container 51 can be detached after the first valve V1 and the second valve V2 are closed.

The cleaning device 52 is connected to a portion between the liquid container 51 and the first valve V1, which are disposed in the liquid-feeding line 50, and includes a cleaning solution container 60, disposed between a gas-introducing port 58 to introduce gas to the cleaning device 52 and a piping sub-line 59 connected to the piping sub-line 56 of the liquid-feeding line 50, to temporarily store a cleaning solution and then feed the cleaning solution to the liquid container 51 and also includes a fourth valve V4 and fifth valve V5 disposed at corresponding two connections in the piping sub-line 59 connected to the cleaning solution container 60. The cleaning solution container 60 can be detached after the fourth valve V4 and the fifth valve V5 are closed.

The purge device 54 is connected to a portion between the nozzle 53 and the third valve V3, which are disposed in the liquid-feeding line 50, and includes a piping line 62 to connect a gas-introducing port 61 to introduce gas to the purge device 54 with the piping sub-line 56 in the liquid-feeding line 50 and also includes a sixth valve V6 disposed in the piping line 62.

The waste liquid-treating system 43 includes a cover 70, disposed in the chamber 40 so as to cover the periphery and lower surface of the substrate stage 41, to collect the liquid material splashed by the centrifugal force due to the rotation of the substrate stage 41; a first container 71, connected to the cover 70, to temporarily store the liquid material collected with the cover 70; and a second container 72 connected to the first container 71 via a seventh valve V7. The second container 72 can be detached after the seventh valve V7 is closed. The waste liquid-treating system 3 corresponds to a waste liquid-storing means according to the present invention and is used in a step of removing the waste liquid according to needs.

The oxidative, reductive, and inert gases can be fed to the chamber 40 from the gas-feeding system 44 according to needs in the same manner as that of the pre-treating subsection 20. The evacuation system 45 is connected to a vacuum unit (not shown), such as a dry pump, and therefore the chamber 40 can be decompressed or maintained substantially at an atmospheric pressure by opening or closing a variable valve V8 according to the flow rate of gas fed to the chamber 40. Furthermore, when the treated substrate W is transported to another treating chamber, the evacuation system 45 has a function of evacuating the chamber 40 filled with atmosphere gas and then introducing the inert gas into the chamber 40, thereby substantially preventing or preventing the oxidative gas contained in the atmosphere gas from entering another treating chamber. The chamber 40 includes a measuring device to measure the oxygen content and the content of an oxidant, such as water. Both the oxygen content and the oxidant content in the chamber 40 can be maintained at 10 ppm or less, actually 1 ppm or less, by measuring the oxygen content and the moisture content with measuring device and by using the functions of the gas-feeding system 44 and the evacuation system 45.

According to the above configuration, the substrate W is supported on the substrate stage 41 by vacuum aspiration and the liquid material is dropped on the substrate W from the nozzle 53. The liquid material temporarily stored in the liquid container 51 is ejected to the substrate W from the nozzle 53 while the liquid container 51 is pressurized with inert gas, such as nitrogen gas, fed from the gas-introducing port 55 and the flow rate is controlled with the MFC 57. The ejected liquid material is spread at the center of the substrate W and is then further spread over the substrate W by the rotation of the substrate stage 41, thereby forming a coating. The MFC 57 need not necessarily be used and the quantity of the liquid material ejected on the substrate can be controlled only by opening or closing the third valve V3.

In this procedure, a part of the liquid material, which does not remain on the substrate W, that is, which does not form the coating, is splashed toward the periphery of the substrate stage 41 by the centrifugal force due to the rotation of the substrate stage 41. The splashed liquid material is trapped with the cover 70 disposed in the chamber 40, introduced into the first container 71, and then temporarily stored therein. The liquid material stored in the first container 71 is introduced into the second container 72 by opening the seventh valve V7 and then decompressing the second container 72. After the seventh valve V7 is closed, the second container 72 is detached and the liquid material is then discarded. The procedure to transport the liquid material from the first container 71 to the second container 72 is preferably preformed during the formation of the coating. Since waste liquid containing an organic solvent is stored in the second container 72, the second container 72 is preferably connected to an evacuation line 46 to remove toxic gas. The evacuation line 46 may be connected to the evacuation system 45 via a valve. When the liquid material is toxic or spontaneously flammable, the waste liquid can be safely discarded by placing a deactivator, which lowers such activity to render the liquid material harmless, in the second container 72 in advance.

When, for example, the operation of the coating subsection 21 is temporarily stopped, the liquid material is changed to another type, or the liquid container 51 is empty and therefore needs to be changed, the inside of the liquid container 51 is cleaned with the cleaning device 52. The cleaning procedure is will now be described. For the liquid material, cyclosilane to form a silicon layer is herein used, as described below.

The cleaning solution container 60 storing the cleaning solution is connected to the piping sub-line 59 of the cleaning device 52. After most of the liquid material in the liquid container 51 is drained out, the second valve V2 is closed, the fourth valve V4 and the fifth valve V5 are opened, and the cleaning solution container 60 is pressurized using inert gas fed from the gas-introducing port 58 of the cleaning device 52, thereby introducing the cleaning solution into the liquid container 51.

The cleaning solution used includes an inorganic alkaline, an organic alkaline, and an alcohol solution. In the present invention, a deactivator such as IPA (isopropanol) is preferably used. Since cyclosilane and higher order silanes, which can be used for the liquid material, spontaneously flame and generate gases harmful to human organism when they are in contact with air, such silanes are decomposed with the deactivator to render them non-flammable and harmless, thereby lowering the activity such as the flammability and harmfulness.

As well as the above, when the operation of the coating subsection 21 is temporarily stopped or the liquid material is changed to another type, the liquid material is purged from the nozzle 53 with the purge device 54 in order to prevent clogging caused by the volatilization of an organic solvent contained in the liquid material and the hardening of the liquid material. The purge procedure is as follows: the third valve V3 is closed, and the sixth valve V6 is then opened to introduce the inert gas from the gas-introducing port 61.

Figure 4:
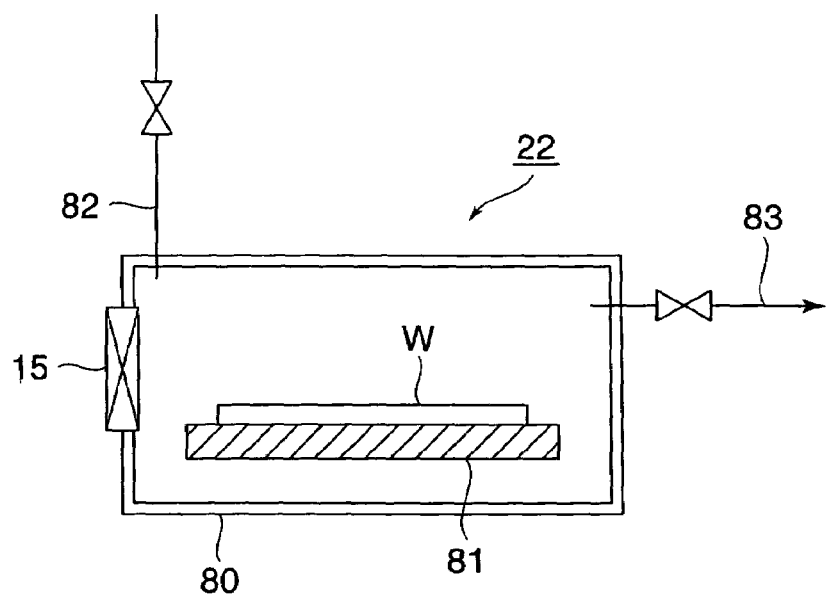
FIG. 4 is a schematic showing a first heat-treating subsection.

FIG. 4 is a schematic of the first heat-treating subsection 22.

The first heat-treating subsection 22 is connected to the connecting section 13 via one of the gate valves 15 and includes a chamber (treating chamber) 80 that can be kept airtight; a heating device 81 to support and heat the substrate W; a feeding system 82 to feed various atmosphere gases to the chamber 80; and an evacuation system 83 to evacuate the chamber 80. For the heating device 81, a hot plate is preferably used. The solvent contained in the coating on the substrate W can be removed by heating the substrate W with the heating device 81, thereby solidifying the coating. The substrate temperature can be controlled within the range of 80 to 200° C. with the heating device 81, and both the oxygen content and the content of an oxidant, such as water, in the chamber 80 can be maintained at 10 ppm or less, actually 1 ppm or less, with the evacuation system 83. The feeding system 82 to feed the various atmosphere gases to the chamber 80 and the evacuation system 83 to evacuate the chamber 80 are main components of the control device to independently control a treating atmosphere in the chamber of the first heat-treating subsection 22, that is, the chamber 80.

Figure 5:
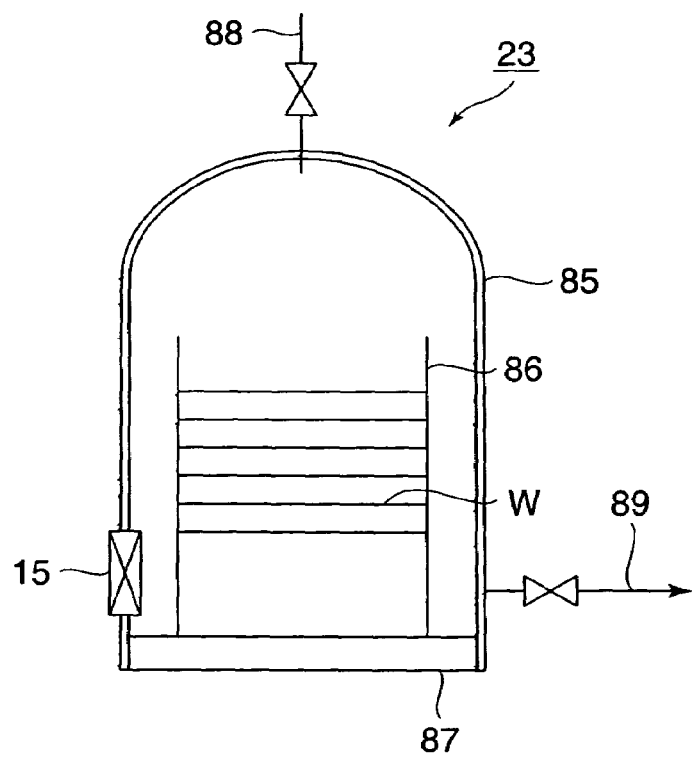
FIG. 5 is a schematic showing a second heat-treating subsection.

FIG. 5 is a schematic of the second heat-treating subsection 23.

The second heat-treating subsection 23, which corresponds to a heating furnace (hot wall type), is connected to the connecting section 13 via one of the gate valves 15 and includes a quartz tube (treating chamber) 85 that can be kept airtight; a substrate holder 86, placed in the quartz tube 85, made of quartz, and equipped with a plurality of shelves, to support the substrate W; a susceptor 87, including a heating means (not shown) and a vertical moving device, to support the substrate holder 86; a feeding system 88 to feed various atmosphere gases to the quartz tube 85; and an evacuation system 89 to evacuate the quartz tube 85. The substrate W is heated at a temperature higher than the heating temperature of the first heat-treating subsection 22 using the furnace to enhance the coating properties, thereby obtaining a coating having desired properties. Both the oxygen content and the content of an oxidant, such as water, in the furnace can be maintained at 10 ppm or less, actually 1 ppm or less, with the evacuation system 89. In order to enhance the coating properties, reductive gas, such as hydrogen gas, may be used for the atmosphere. The feeding system 88 to feed the various atmosphere gases to the quartz tube 85 and the evacuation system 89 to evacuate the quartz tube 85 are main components of the control device to independently control a treating atmosphere in the chamber of the second heat-treating subsection 23, that is, the quartz tube 85.

In the third heat-treating subsection 24, a laser-annealing unit or a lamp-annealing unit, which is not shown, is used for a heating device. In this case, heat treatment is performed at a temperature higher than the heating temperature of the second heat-treating subsection 24, thereby achieving further enhanced coating properties. The third heat-treating subsection 24 also includes a feeding system to feed various atmosphere gases to a chamber and an evacuation system to evacuate the chamber, which are main components of the control device to independently control a treating atmosphere in the chamber.

The connecting section 13 includes a control member (control device) to control atmosphere gas in the connecting section 13 and keeps the substrate W in a desired atmosphere without exposing the substrate W to the outside atmosphere when the substrate W is transported from one bf the treating subsections 20–24 (treating chambers) to another subsection or temporarily stored. The control member (control device) includes a device to select atmosphere gas, a device to feed the selected gas, and an evacuation device, such as a dry pump. Either the oxygen content or the content of an oxidant, such as water, in atmosphere gas in a predetermined treating chamber can be maintained at 10 ppm or less, actually 1 ppm or less, with the evacuation device and by feeding inert gas (for example, nitrogen gas) having sufficiently high purity. The pressure of the connecting section 13 and the subsections of the treating section 11 is usually maintained at a pressure slightly higher than an atmospheric pressure in order to substantially prevent or prevent air from entering the apparatus. The connecting section 13 includes a cryopump, which is not shown, in addition to the dry pump of the evacuation device, thereby removing oxygen and moisture in atmosphere gas of a predetermined treating chamber according to needs.

The treating subsections 20–24 each include a control device similar to the above control device having such a configuration.

As described above, the above apparatus has a remarkably simple configuration as compared with related art CVD apparatuses and thus is exceptionally inexpensive. The apparatus has higher throughput as compared with such CVD apparatuses and the maintenance thereof is easy, thereby increasing the availability factor. In the CVD apparatuses, thin-films are formed on the inner wall of a film-forming chamber and the thin-films are peeled off, thereby causing defects. However, such a problem is not caused in this apparatus. In the CVD apparatuses, there are many controlling parameters to form films and therefore the film thickness and the film properties are affected by a change in any parameter. The parameters include the flow rates and ratio of various gases, pressure, substrate temperature, plasma power, the distance between a plasma electrode and a substrate, and treating time. However, in this apparatus, since there are a few parameters to control the film thickness and the film properties, films having constant quality can be formed. The parameters include an atmosphere, coating conditions, and heat-treating conditions.

Since atmosphere gases in the treating subsections 20–24 and the connecting section 13 can be independently controlled with the control device each provided to the corresponding treating subsections 20–24 and connecting section 13, atmosphere gas used in each step can be controlled in a desired manner. Thus, the content of oxidants contained in obtained thin-films can be reduced to a minimum, thereby obtaining a thin-film having desired properties.

Furthermore, since the coating subsection 21 includes the cleaning device 52 and the waste liquid-treating system 43, the apparatus maintenance can be efficiently performed, the apparatus performance can be enhanced, and the manufacturing cost of products can be reduced due to the enhanced performance.

[Method of Forming Conductive Coating]

A method of applying a liquid material containing conductive particles to form a conductive coating is described below.

The conductive coating can be formed with the apparatus shown in FIG. 1. In this case, the following liquid material is used: a liquid material containing fine particles of a conductive substance which are dispersed in liquid, for example, an organic solvent. For example, the following liquid material is applied onto a substrate by a spin-coating process: a liquid material containing fine silver (Ag) particles, dispersed in an organic solvent, such as terpineol or toluene, having a particle size of 8–10 nm.

In the first heat-treating subsection 22, heat treatment is performed at about 100° C. to remove the solvent. Furthermore, in the second heat-treating subsection 23, heat treatment is performed at about 250–300° C., thereby obtaining a conductive film having a thickness of, for example, several hundred nm. The conductive substance for the fine particles includes Au, Al, Cu, Ni, Co, Cr, and ITO (Indium Tin Oxide) in addition to Ag. Such a conductive film can be formed with a thin-film forming apparatus.

Since the conductive coating has a resistance larger than the bulk resistance by one order of magnitude in some cases, the conductive coating is further heat-treated at several hundred degrees to reduce the conductive coating resistance in the third heat treating subsection 24. According to the heat treatment, the contact resistance between a source region of a TFT and a source line formed by processing the conductive coating can be reduced. Furthermore, the contact resistance between a drain region and a drain electrode formed by processing the conductive coating can be reduced. That is, when the conductive coating is heat-treated at a high temperature for a short time by a laser-annealing process or a lamp-annealing process in the third heat-treating subsection 24, the conductive coating resistance and the contact resistance can be securely reduced. Furthermore, the reliability can be enhanced by forming a plurality of layers containing different metals. Since base metal including Al and Cu is readily oxidized in air, noble metal including Ag and Au, which are hardly oxidized in air, is preferably formed on such base metal.

[Method of Forming Insulating Coating]

A method of forming an insulating coating is described below.

The insulating coating can be manufactured with the apparatus shown in FIG. 1. A liquid material that can be used to form such an insulating coating by a coating process followed by heat treatment includes polysilazanes (a generic term of polymers having a Si—N bond). One of the polysilazanes is the compound [SiH$_2$NH]n (n represents a positive integer), which is called polyperhydrosilazane and is available from Clariant (Japan) K.K. A compound having the chemical formula [SiH$_2$NH]n in which H is substituted by an alkyl group (for example, a methyl group, an ethyl group, or the like) is called organic polysilazane and is distinguished from inorganic polysilazane. In this exemplary embodiment, the inorganic polysilazane is preferably used. The polysilazane is mixed with liquid, such as xylene, and the resulting mixture is applied onto a substrate by a spin-coating process.

A liquid material that can be used to form the insulating coating by a coating process followed by heat treatment includes a SOG (Spin On Glass) film. The SOG film is a polymer having a siloxane bond as a basic structure and includes an organic SOG film having an alkyl group and an inorganic SOG film having no alkyl group. Alcohol or the like is used for the solvent. The SOG film is used for an interlayer insulating layer of LSI for the purpose of planarization. There is a problem in that the organic SOG film is readily etched by oxygen plasma treatment and the inorganic SOG film cracks readily even if it has a thickness of several hundred nm. Therefore, these films are hardly used for the interlayer insulating layer alone but used for a planarizing layer disposed on a CVD insulating layer. In contrast, the polysilazane has high crack resistance and oxygen plasma resistance. Thus, the polysilazane can be used for a single insulating layer having a certain thickness.

After the substrate coated with the liquid material is transported to the first heat-treating subsection 22 and then heat-treated at 100° C. for several minutes to remove an organic solvent contained in the coating, the resulting substrate is transported to the second heat-treating subsection 23 and then heat-treated at about 300–400° C. for about 60 minutes in a steam atmosphere, thereby converting the coating into a SiO$_2$ layer. When, for example, a gate insulating layer is formed, the properties of the interface between the gate insulating layer and a silicon layer, as well as the layer thickness and the layer properties, must be controlled because the gate insulating layer is important in controlling the electrical properties of TFTs. Thus, after the heat treatment performed in the second heat-treating subsection 23, in addition to treatment, performed in the pre-treating chamber, to clean the silicon layer surface before the coating formation of the insulating layer, the substrate is preferably heat-treated at a temperature higher than the heat-treating temperature of the second heat-treating subsection 23 by a laser-annealing process or a lamp-annealing process for a short time in the third heat-treating subsection 24.

[Method of Forming Silicon Coating]

A method of forming a silicon coating, which is a semiconductor coating, is described below.

The silicon layer can be manufactured with the apparatus shown in FIG. 1. A liquid material that can be used to form the silicon coating by a coating process followed by heat treatment includes, for example, cyclosilane. In the present invention, another liquid material that can be used to form the silicon layer includes a solution containing a cyclic silicon compound represented by the general formula $Si_nX_m$ (where n represents an integer greater than or equal to 5, m represents an integer expressed by n, 2n-2, or 2n, X represents a hydrogen atom and/or a halogen atom). The silicon compound is essential for the solution. This solution may contain silicon compounds such as n-pentasilane, n-hexasilane, and n-heptasilane.

A substrate coated with the liquid material in the coating subsection 21 is treated in the first heat-treating subsection to remove a solvent and then heat-treated at 300–500° C. in the second heat-treating subsection 23, thereby obtaining a metal silicon layer. The resulting substrate is further heat-treated at a higher temperature for a short time by a laser-annealing process or a lamp-annealing process in the third heat-treating subsection 24, thereby obtaining a crystalline silicon layer. Since melt crystallization is performed by the laser-annealing process and solid-phase crystallization is performed by the lamp-annealing process, the resulting silicon layer is improved in crystallinity, denseness, and adhesion to another layer as compared with the silicon layer treated only in the second heat-treating subsection 23.

Second Exemplary Embodiment

Figure 6:
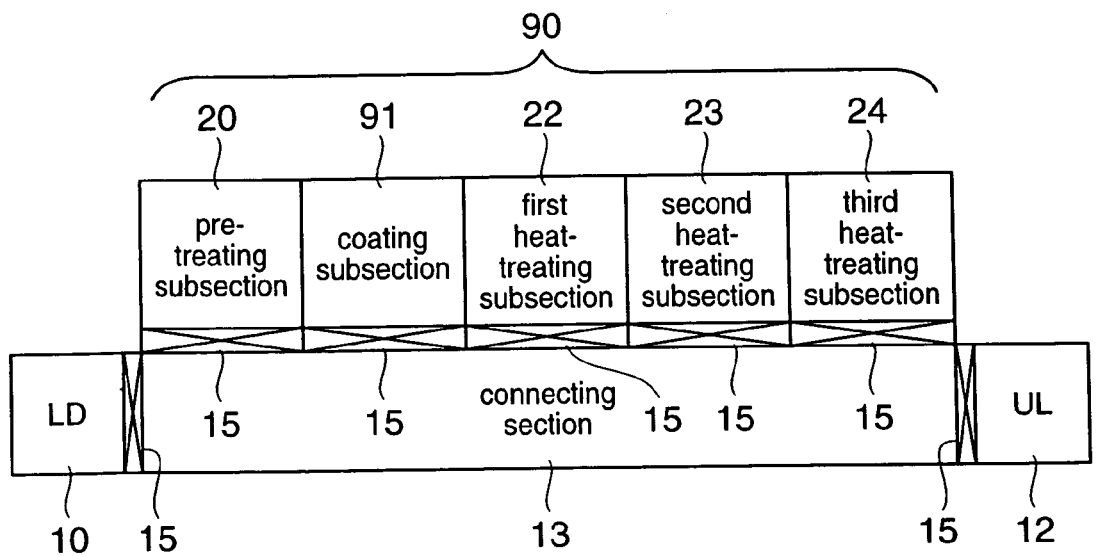
FIG. 6 is a schematic showing a thin-film forming apparatus according to a second exemplary embodiment.

FIG. 6 is a schematic showing a second exemplary embodiment of a thin-film forming apparatus of the present invention. In FIG. 6, the same component as that of FIG. 1 is represented by the same reference numeral as that of FIG. 1 and the description is omitted.

The thin-film forming apparatus of this exemplary embodiment has the same basic configuration as that of the apparatus of the first exemplary embodiment, as shown in FIG. 1. In a coating subsection 91 (coating step), provided to a treating section 90, to apply a liquid material onto a substrate, an inkjet process is used to apply the liquid material instead of a spin-coating process.

Figure 7:
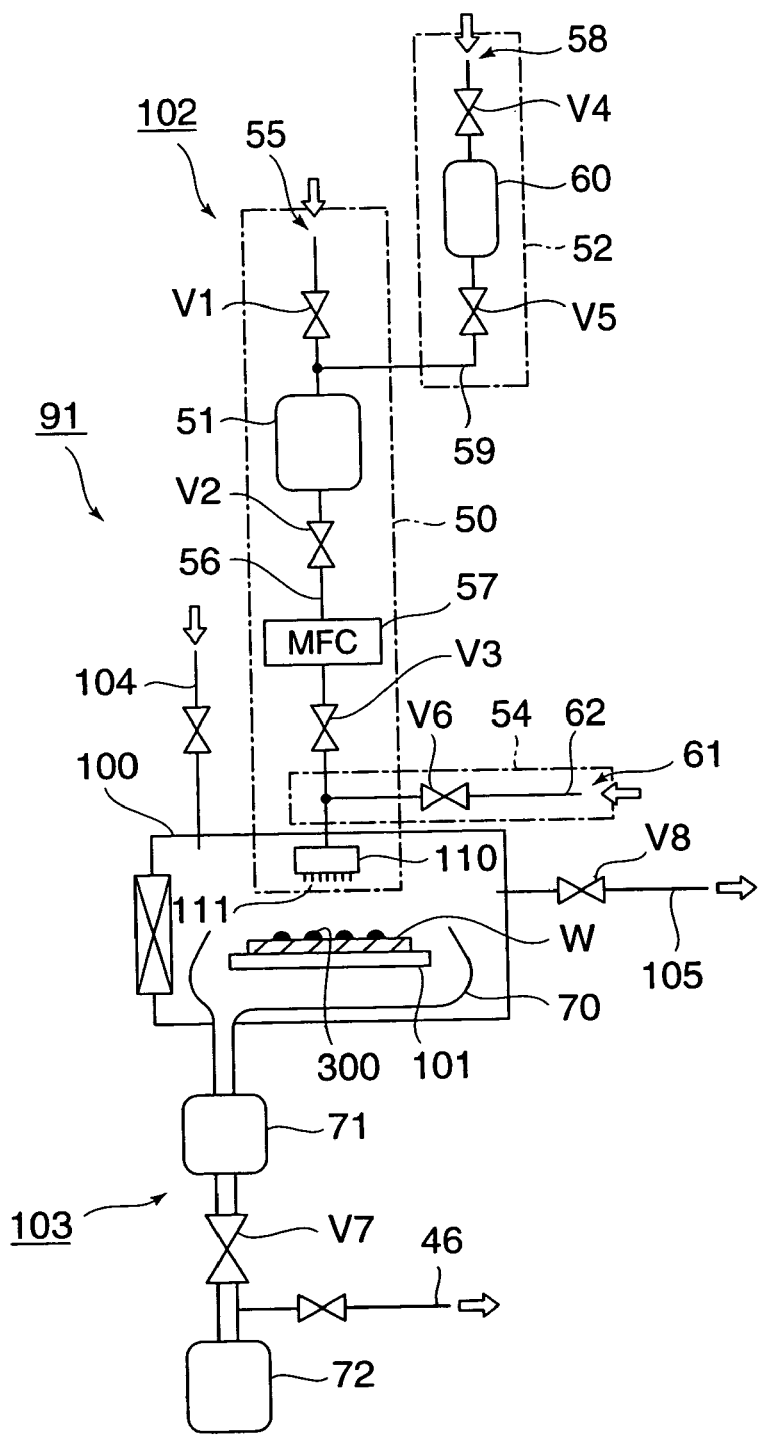
FIG. 7 is a schematic showing an inkjet treating subsection.

FIG. 7 is a schematic of the coating subsection 91.

The coating subsection 91, which corresponds to a coating unit, is connected to a connecting section 13 via one of gate valves 15 and includes a chamber (treating chamber) 100 that can be kept airtight; a substrate stage 101 to support a substrate W; a liquid-feeding system 102 to feed a liquid material to the substrate W; a waste liquid-treating system 103 to trap the liquid material splashed or dropped on a dummy and to recover the trapped liquid material, which is a waste liquid; a feeding system 104 to feed various atmosphere gases to the chamber 100; and an evacuation system 105 to evacuate the chamber 100. The feeding system 104 to feed the various atmosphere gases to the chamber 100 and the evacuation system 105 to evacuate the chamber 100 are main components of the control device to independently control a treating atmosphere in a chamber of the coating subsection 91, that is, the chamber 100.

The liquid-feeding system 102, the waste liquid-treating system 103, the feeding system 104, and the evacuation system 105 have substantially the same configurations as those of the liquid-feeding system 42, the waste liquid-treating system 43, the feeding system 44, and the evacuation system 45, respectively, provided to the coating subsection 21. Therefore, the description is omitted and portions different from those of the coating subsection 21 are described.

In the coating subsection 91, the liquid material is fed to a dispenser head 110 from a liquid container 51 through a MFC 57 and then ejected from a plurality of nozzles 111 provided to the dispenser head 110, thereby forming a vast number of dots 300 on the substrate W. Since the dispenser head 110 and the substrate stage 101 have a device to freely control the relative position, the liquid material can be applied to desired points on the substrate W in a desired quantity.

Figure 8:
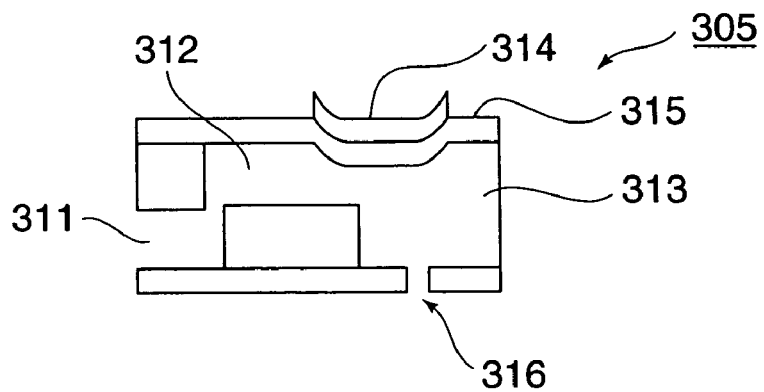
FIG. 8 is a partly enlarged schematic showing a dispenser head shown in FIG. 7.

FIG. 8 is a sectional view of each nozzle 111 in detail.

Figure 9:
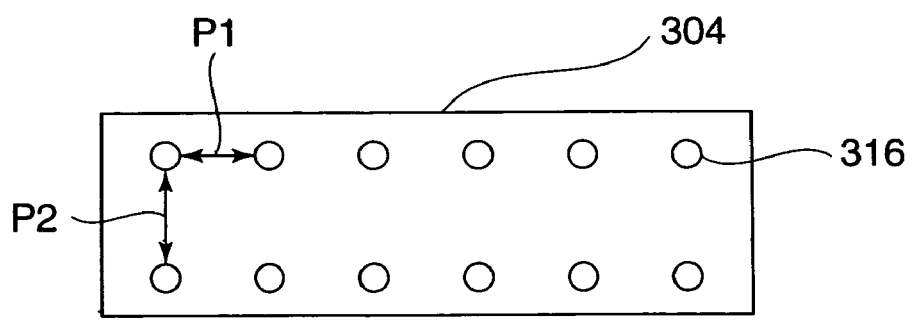
FIG. 9 is a partly enlarged schematic showing a dispenser head shown in FIG. 7.

The configuration shown in FIG. 8 is the same as that of a head of a so-called inkjet printer and ejects the liquid material with the vibration generated by a piezoelectric element. The liquid material is fed from an inlet 311 through a feeding port 312 and then stored in a cavity 313. A piezoelectric element 314 adhering to a vibrating plate 315 expands or contracts to cause the vibrating plate 315 to vibrate, thereby increasing or decreasing the volume of the cavity 313. The liquid material is ejected from nozzle holes 316 when the volume of the cavity 313 is decreased, and the liquid material is fed from the feeding port 312 to cavity 313 when the volume of the cavity 313 is increased. A plurality of the nozzle holes 316 are arranged, for example, in a two dimensional manner, as shown in FIG. 9. The substrate W and/or the dispenser head 110 move relative to each other, as shown in FIG. 7, thereby applying the liquid material over the substrate surface in a dotted manner.

In FIG. 9, the nozzle holes 316 are arranged at an interval P1 of several hundred μm in the horizontal direction and an interval P2 of several mm in the vertical direction. The nozzle holes 316 have a diameter of several tens to several hundreds μm. The quantity of the liquid material ejected in one shot is several to several hundreds μg, and the droplets of the ejected liquid material have a diameter of several to several tens μm. Each dot formed by the application has a circular shape having a size of several to several ten μm. When these dots are formed by the application such that the dots are connected to each other in one-dimensional manner, a thin-film having a striped pattern having a line width of several to several tens μm can be formed. This method is one of direct writing methods by which thin-films are formed at desired portions and has such advantages that not only a photolithographic step for patterning is not necessary but also the utilization efficiency of the liquid material is high. In order to apply the liquid material entirely over the substrate, the dots 300 are formed entirely over the substrate and the resulting substrate is then spun at a spinning rate of several hundreds to several thousands rpm for several seconds, thereby obtaining a coating having a uniform thickness. The coating thickness can be controlled not only by the spinning rate and spinning time of the substrate but also by the diameter of the nozzle holes 316 and the interval between the dots 300.

According to this liquid-applying method using the inkjet process, the liquid material is applied over the substrate in a dotted manner and the resulting substrate is moved, for example, spun, so as to coat areas which are disposed between the dots 300 and have no liquid material with the liquid material. Thereby, the liquid material can be efficiently used. This method can be used to form a conductive layer, an insulating layer, and a semiconductor layer using the coating described in the first exemplary embodiment. Thus, this method is greatly effective in reducing the manufacturing cost of image display units and electronic apparatuses including thin-film devices including these thin-films.

Third Exemplary Embodiment

Figure 10:
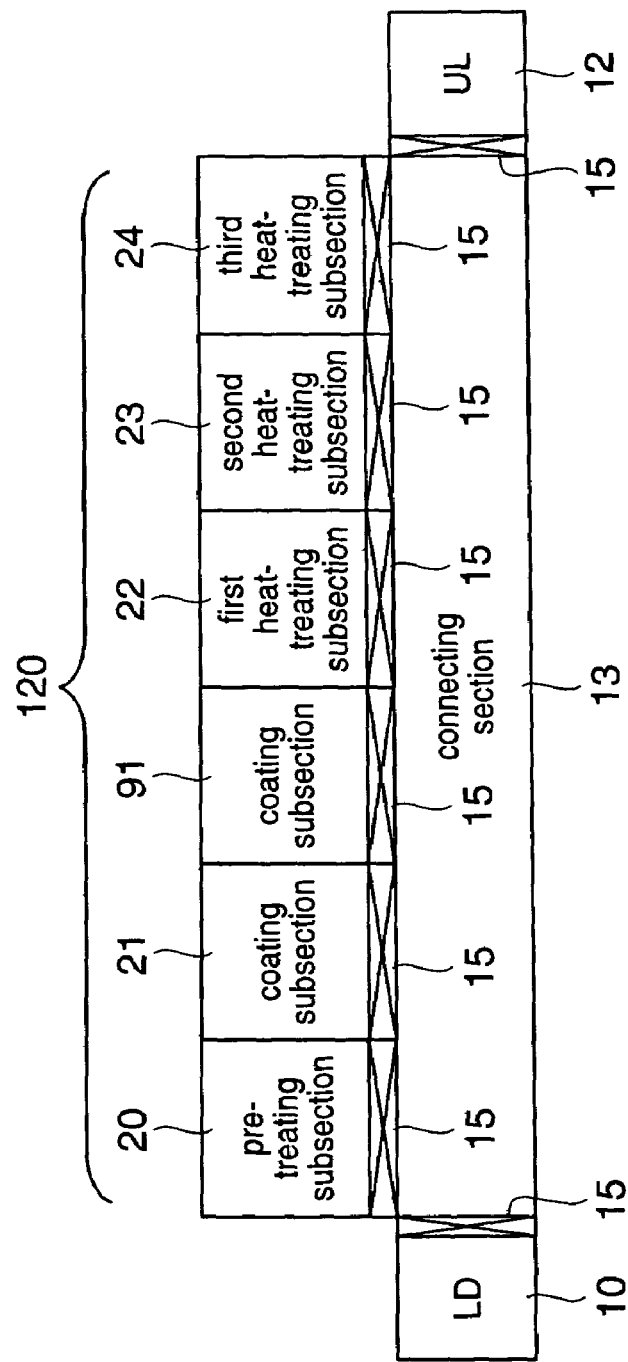
FIG. 10 is a schematic showing a thin-film forming apparatus according to a third exemplary embodiment.
Figure 11:
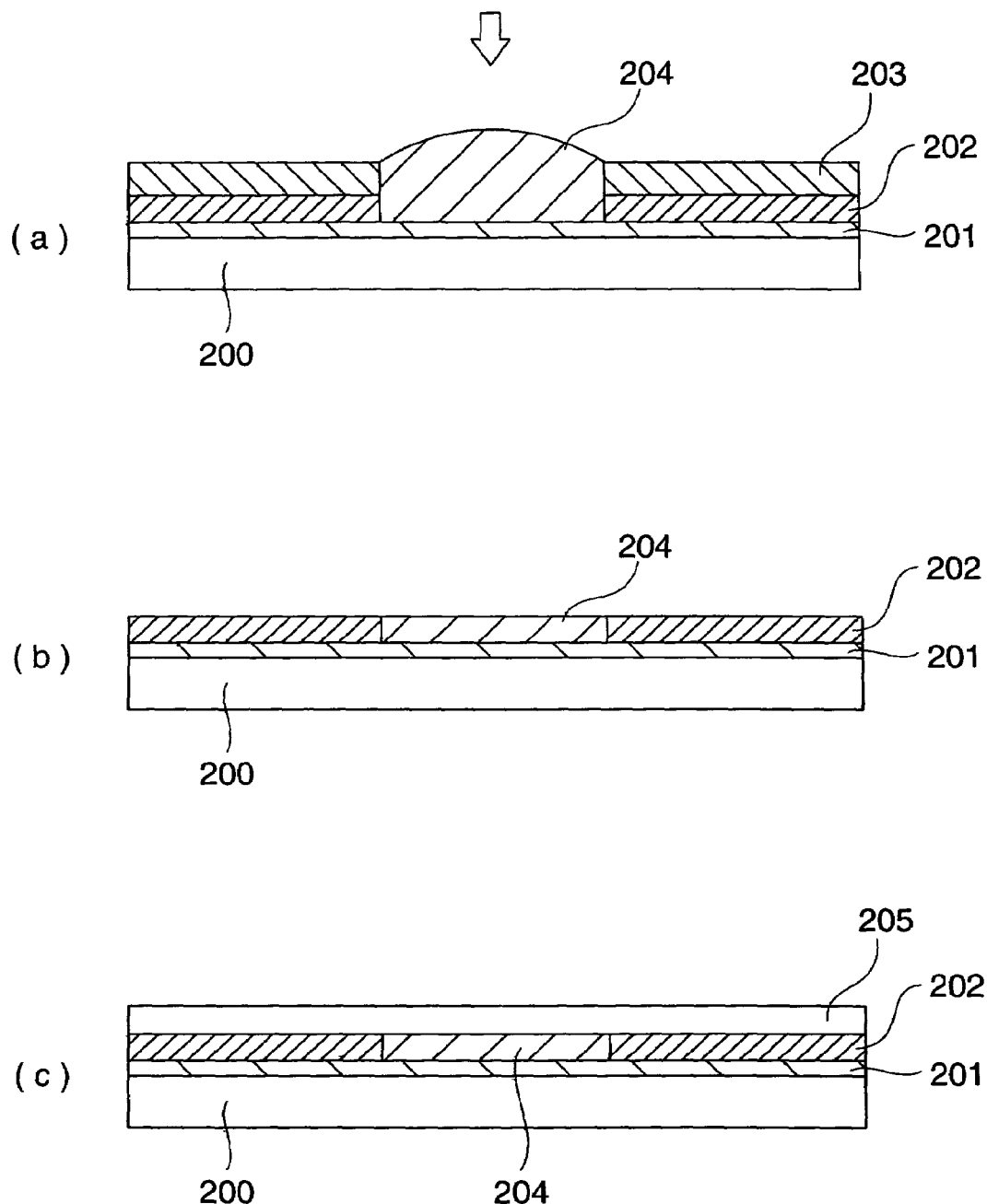
FIGS. 11(a)–11(c) are schematics showing steps of manufacturing a semiconductor device.
Figure 12:
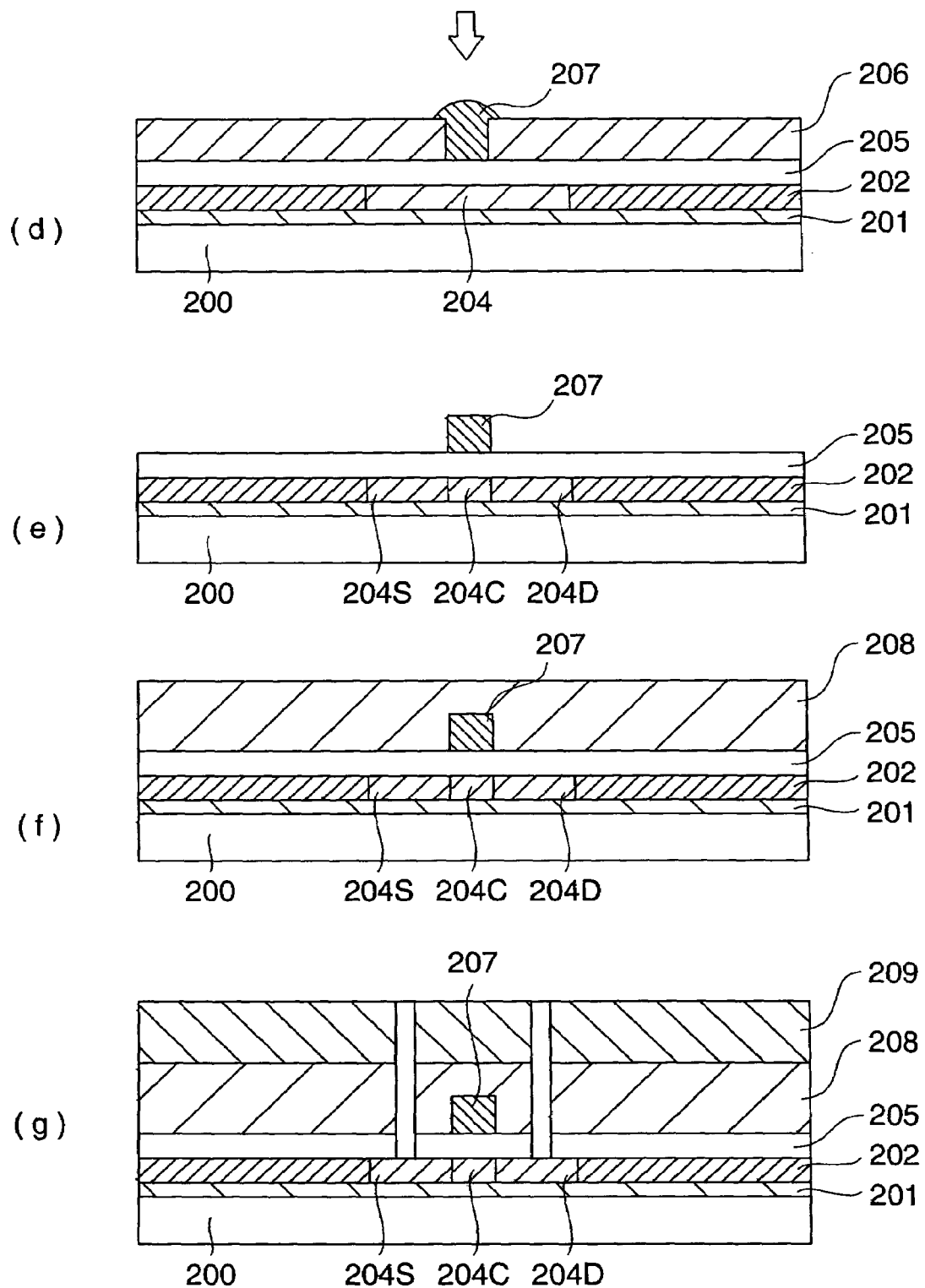
FIGS. 12(d)–12(g) are schematics showing steps of manufacturing the semiconductor device.
Figure 13:
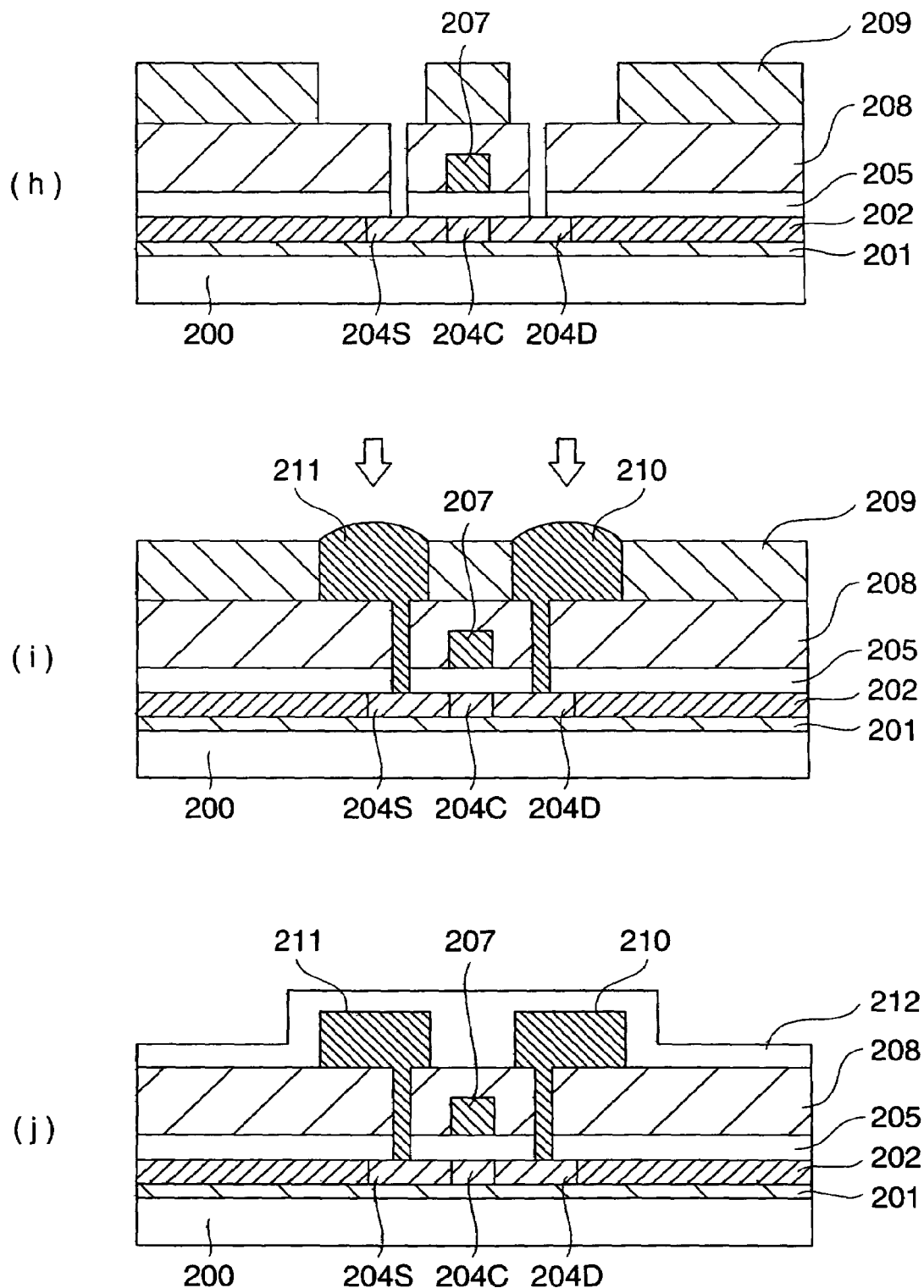
FIGS. 13(h)–13(j) are schematics showing steps of manufacturing the semiconductor device.

FIG. 10 is a schematic showing a third embodiment of a thin-film forming apparatus of the present invention. In FIG. 10, the same component as those of FIGS. 1 and 6 is represented by the same reference numeral as those of FIGS. 1 and 6 and the description is omitted.

The thin-film forming apparatus of this exemplary embodiment has the same basic configuration as those of the apparatuses of the first and second exemplary embodiments, as shown in FIGS. 1 and 6, respectively. A treating section 120 includes a coating subsection 21 to apply a liquid material by a spin-coating process and a coating subsection 91 to apply the liquid material by an inkjet process. These subsections are used in a coating step of applying the liquid material onto a substrate.

According to such a configuration, a method of applying the liquid material can be selected depending on the type and/or shape of the substrate. For example, when a thin-film is formed over the substrate, the application can be efficiently performed with the coating subsection 21 by the spin-coating process.

In contrast, when the liquid material is applied with the coating subsection 91 by the inkjet process, a striped pattern having a line width of 10–20 μm can be formed because nozzle holes 316 have a smaller diameter. If this technique is used to form silicon layers and conductive layers, the following method can be obtained: a direct writing method in which a lithography step is not necessary when, for example, thin-films for TFTs are formed. When TFTs are formed using a several ten-μm design rule, liquid crystal displays can be manufactured using a thin-film forming technique, in which the direct writing method and the applying method are combined, without using a CVD system, a sputtering system, an ion-implanting or ion-doping system, an exposing system, and/or an etching system.

Fourth Exemplary Embodiment

[Method of Forming Semiconductor Device]

FIGS. 11(a) to 13(j) show significant steps of manufacturing a semiconductor device (for example, TFT).

As shown in FIG. 11(a), a first insulating layer (base insulating layer) 201 is formed on a silicon substrate 200, and a second insulating layer 202 is formed on the first insulating layer 201. The first insulating layer 201 and the second insulating layer 202 are formed according to the following procedure: a first liquid material containing a solvent mixed with, for example, polysilazane is applied by a spin-coating process and the resulting material is then heat-treated to form $SiO_2$.

Next, patterning is performed by a photo etching process to form a silicon layer-forming region. A first resist layer 203 is formed on the second insulating layer 202, and the silicon layer-forming region of the second insulating layer 202 is etched using the pattern of the first resist layer 203. After a coating is formed, droplets of a second liquid material containing a silicon atom are ejected toward the silicon layer-forming region by an inkjet process. When the surface of the first resist layer 203 is processed using $CF_4$ plasma and thereby has lyophobicity, the second liquid material can smoothly reach the silicon layer-forming region. After the application of the second liquid material is completed, first heat treatment is performed at 100 to 200° C. to remove an organic solvent contained in the second liquid material.

As shown in FIG. 11(b), after the heat treatment, the first resist layer 203 is peeled off and the silicon coating is solidified by second heat treatment and third heat treatment, thereby obtaining a crystalline silicon layer 204.

As shown in FIG. 11(c), after the formation of the silicon layer 204, a third insulating layer 205 functioning as a gate insulating layer is formed over the silicon layer 204 and the second insulating layer 202.

The third insulating layer 205, in the same manner as the lower insulating layers, is formed according to the following procedure: the first liquid material containing the solvent mixed with, for example, polysilazane is applied by a spin-coating process and the resulting material is then converted into $SiO_2$ by heat treatment.

As shown in FIG. 12(d), after the formation of the third insulating layer 205, patterning is performed by a photo etching process in the same manner as in FIG. 11(a) to form gate electrode regions. A second resist layer 206 is formed on the third insulating layer 205 and patterning is performed to form gate electrode-forming regions. In this procedure, surface treatment for rendering the resist surface lyophobic may be performed according to the following procedure: the surface of the second resist layer 206 is processed using fluorine-containing gas plasma. After the surface treatment, droplets of a third liquid material containing metal particles, such as gold particles are ejected toward the gate electrode-forming regions by a droplet-ejecting process. Since the second resist layer 206 is lyophobic due to the effect of fluorination by plasma treatment and the third insulating layer 205 that is in contact with the third liquid material is lyophilic, the third liquid material can smoothly reach silicon layer regions. After the application of the third liquid material is completed, an organic solvent contained in the third liquid material is removed by the first heat treatment. In the first heat treatment, the heating temperature is about 100° C. and the heating time is several minutes.

As shown in FIG. 12(e), after the first heat treatment, the second resist layer 206 is peeled off and gate electrode layers are densified by the second heat treatment, thereby obtaining gate electrodes 207. After the formation of the gate electrodes 207, impurities are implanted into the silicon layer 204 and thereby the following regions are formed in the silicon layer 204: source regions 204S and drain regions 204D, which are heavily doped with the impurities, and channel regions 204C disposed between the corresponding source regions 204S and drain regions 204D.

As shown in FIG. 12(f), after the implantation of the impurities into the silicon layer 204, a fourth insulating layer 208 functioning as an interlayer insulating layer is formed over the third insulating layer 205 and the gate electrode 207. The fourth insulating layer 208, in the same manner as the lower insulating layers, is formed according to the following procedure: the first liquid material containing the solvent mixed with, for example, polysilazane is applied by a spin-coating process and the resulting material is then converted into $SiO_2$ by heat treatment. Heat treatment is further performed such that the insulating layers are densified and the implanted impurities are activated.

As shown in FIG. 12(g), a third resist layer 209 to form contact holes is formed on the fourth insulating layer 208, and the fourth insulating layer 208 and the third insulating layer 205 are etched using the third resist layer 209 as a mask to form contact holes.

As shown in FIG. 13(h), after the formation of the contact holes, the third resist layer 209 is patterned by additional exposure to provide regions to form source electrodes and drain electrodes.

As shown in FIG. 13(i), after the formation of the electrode regions by the patterning, droplets of a fourth liquid material containing metal particles, such as aluminum particles are ejected toward the source and drain electrode regions by a droplet-ejecting process. Since the surface of the third resist layer 209 is lyophobic due to plasma treatment and the fourth insulating layer 208 that is in contact with the fourth liquid material is lyophilic, the fourth liquid material can smoothly reach the source and drain electrode regions. After the application of the fourth liquid material is completed, an organic solvent contained in the fourth liquid material is removed by the first heat treatment, thereby obtaining solid metal layers. This heat treatment is performed at 100–200° C.

As shown in FIG. 13(j), after the first heat treatment, the third resist layer 209 is peeled off and the metal layers are fired by the second heat treatment, thereby obtaining source electrodes 211 and drain electrodes 210 both having low resistance. After the formation of the electrodes, a protective layer (protective insulating layer) 212 is formed on the top.

In this fourth exemplary embodiment, the semiconductor device-manufacturing method is described. However, the present invention can be used to manufacture TFT substrates, functioning as active matrix substrates used for electro-optical units, and such active matrix substrates having pixel-switching elements including three-terminal elements and two-terminal elements having a MIM (metal-insulator-metal) structure or a MIS (metal-insulator-silicon) structure. The active matrix substrates used for electro-optical units need to include as a pixel electrode a transparent conductive layer, which can be formed using an ITO coating formed by a coating process. Such an ITO coating can be formed by the same method as that for forming the above electrode pattern. A thin-film multilayer structure of each active matrix substrate having such a MIM structure does not include semiconductor layers but includes conductive layers and insulating layers. The present invention can be used to form such layers.

Furthermore, the present invention can be used to manufacture, for example, electro-optical units, such as organic EL (electroluminescence) elements; ordinary LSI; and thin-film devices having a thin-film multilayer structure including other semiconductor layers different from the above. Furthermore, the present invention can be used to form wiring lines during the production of substrates having wiring lines. In this case, a liquid material containing a metal component is applied to form metal lines on a substrate and thereby a circuit substrate (for example, the above active matrix substrate) is manufactured.

Fifth Exemplary Embodiment (Electro-optical Unit)

An exemplary method to manufacture an organic EL unit, which is an application of the present invention, is described below.

Figure 14:
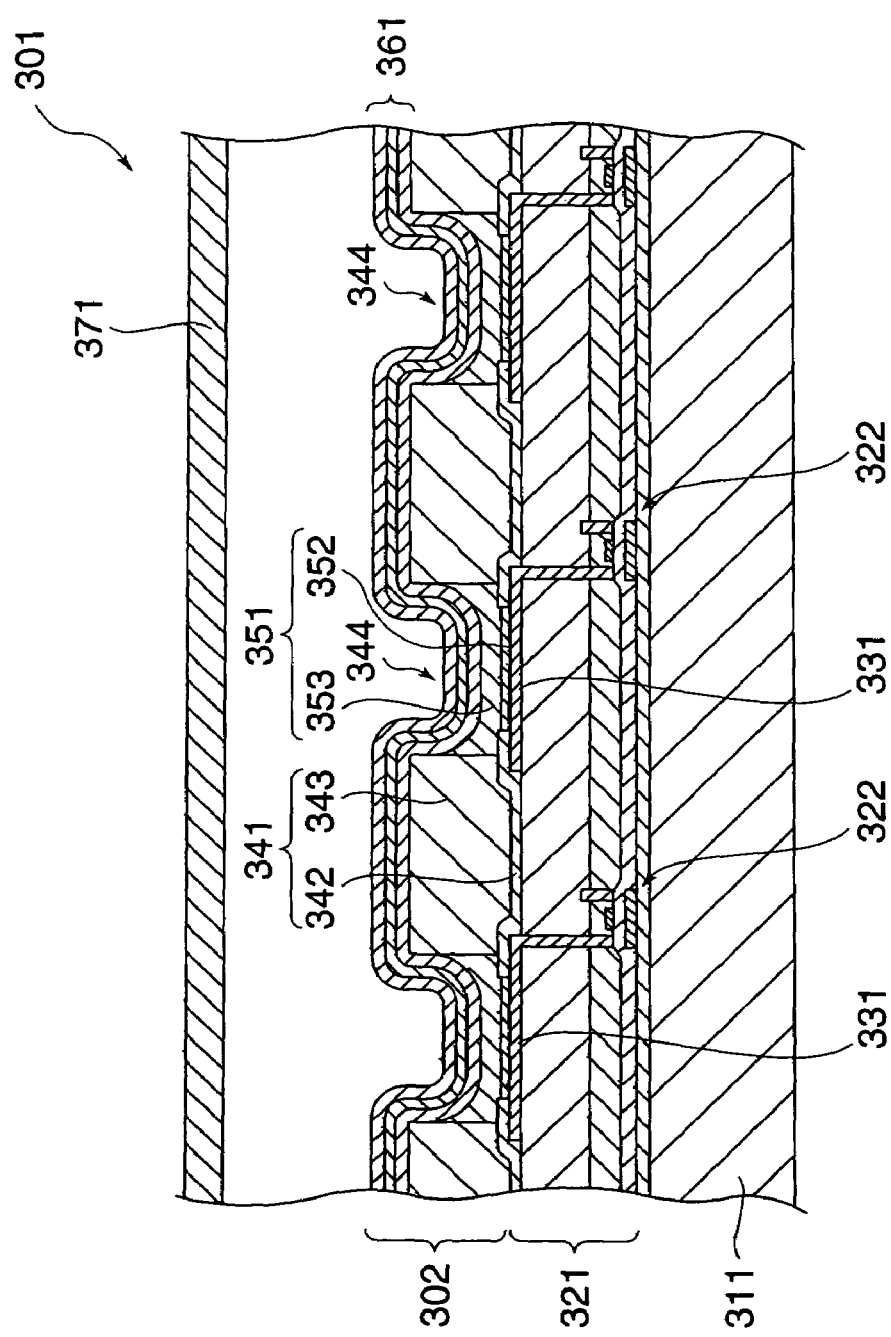
FIG. 14 is a cross-sectional side view showing an organic EL unit.

FIG. 14 is a sectional view showing an organic EL unit including a semiconductor device formed with the above thin-film forming apparatus. This organic EL unit is described below.

As shown in FIG. 14, the organic EL unit 301 has an organic EL element 302 including a substrate 311, a circuit element portion 321, pixel electrodes 331, bank portions 341, emissive elements 351, a cathode 361 (counter electrode), and a sealing substrate 371, and the organic EL element 302 is connected to wiring lines and driving ICs (not shown) of a flexible substrate (not shown). The circuit element portion 321 includes active elements 322, disposed on the substrate 311, each including a TFT and so on, and also includes a plurality of the pixel electrodes 331 arranged on the circuit element portion 321. Part of each active element 322 including the TFT and so on is formed with the above thin-film forming apparatus. In particular, the active element 322 is formed in the steps shown in FIGS. 11(a)–13(j).

The bank portions 341 are disposed between the corresponding pixel electrodes 331 and arranged in a grid pattern. Recessions 344 surrounded by the corresponding bank portions 341 have the corresponding emissive elements 351. The cathode 361 is disposed over the bank portions 341 and the emissive elements 351. The sealing substrate 371 is placed so as to substantially prevent or prevent the entry of outside moisture, oxygen, and so on, thereby reducing or preventing the emissive elements and the TFT elements from being deteriorated.

A process of manufacturing the organic EL unit 301 including the organic EL element includes a bank portion-forming step of forming the bank portions 341, a plasma-treating step for properly forming the emissive elements 351, an emissive element-forming step of forming the emissive elements 351, a counter electrode-forming step of forming the cathode 361, and a sealing step of placing the sealing substrate 371 above the cathode 361.

In the emissive element-forming step, a hole injection layer 352 and an emissive layer 353 are formed in each recession 344, that is, they are formed on each pixel electrode 331 to form each emissive element 351. The emissive element-forming step includes a hole injection layer-forming sub-step and an emissive layer-forming sub-step. The hole injection layer-forming sub-step includes a first ejecting procedure of ejecting a first composition, used for forming the hole injection layers 352, to the pixel electrodes 331 and a first drying procedure of drying the ejected first composition to form the hole injection layers 352. The emissive layer-forming sub-step includes a second ejecting procedure of ejecting a second composition, used for forming the emissive layers 353, to the hole injection layers 352 and a second drying procedure of drying the ejected second composition to form the emissive layers 353.

In the organic EL unit 301, each active element 322 includes the semiconductor device (TFT) described in the fourth exemplary embodiment. Thus, the organic EL unit 301 also includes such a high-performance semiconductor device manufactured at low cost. Accordingly, the organic EL unit 301 can be manufactured at low cost and has high-performance.

An electro-optical unit according to the present invention is not limited to the above type and can be used in various applications including, for example, an electrophoretic unit, a liquid crystal unit, and a plasma display unit.

Sixth Exemplary Embodiment (Exemplary Electronic Apparatus)

In a sixth exemplary embodiment, exemplary electronic apparatuses of the present invention are described.

Figure 15:
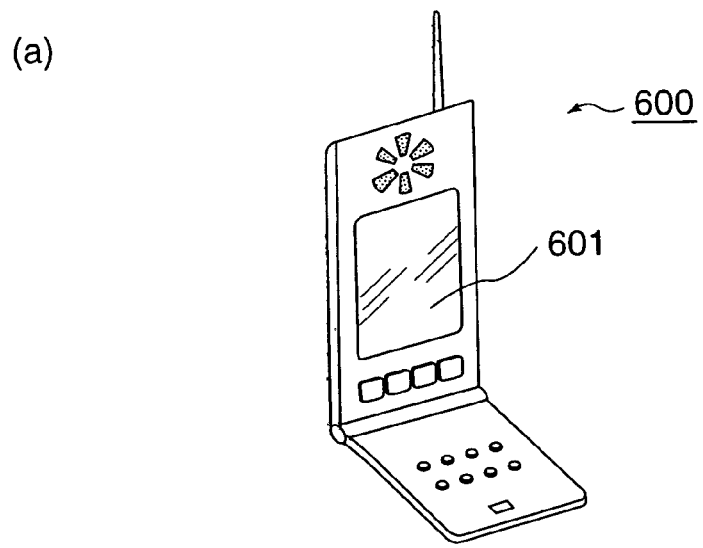
FIG. 15 is a perspective view showing an example of an electronic apparatus according to a fifth exemplary embodiment.
Figure 15:
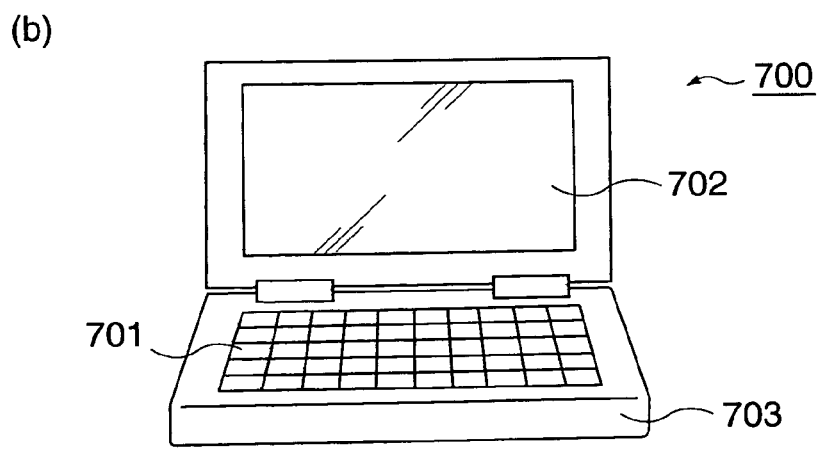
Figure 15:
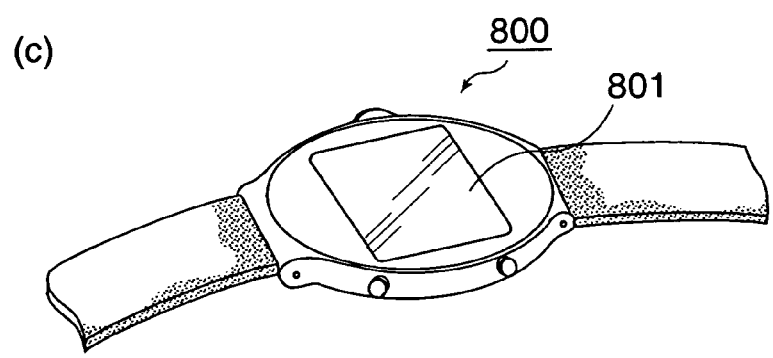

FIG. 15(a) is a perspective view showing an example of a mobile phone.

In FIG. 15(a), reference numeral 600 represents a mobile phone body including a semiconductor device manufactured by the method described in the fourth exemplary embodiment, and reference numeral 601 represents a display portion including an organic EL unit including a semiconductor device manufactured by the method described in the fourth exemplary embodiment.

FIG. 15(b) is a perspective view showing an example of a mobile information processor, such as a word processor, a personal computer or the like.

In FIG. 15(b), reference numeral 700 represents an information processor, reference numeral 701 represents an input portion, such as a keyboard, reference numeral 703 represents an information processor body including a semiconductor device manufactured by the method described in the fourth exemplary embodiment, and reference numeral 702 represents a display portion including an organic EL unit including a semiconductor device manufactured by the method described in the fourth exemplary embodiment.

FIG. 15(c) is a perspective view showing an example of a watch-type electronic device.

In FIG. 15(c), reference numeral 800 represents a watch body, and reference numeral 801 represents a display portion including an organic EL unit including a semiconductor device manufactured by the method described in the fourth exemplary embodiment.

The electronic devices shown in FIGS. 15(a) to 15(c) each include a semiconductor device or organic EL unit of the above exemplary embodiment. Since the electronic devices include such a high-performance electronic device manufactured at low cost, the devices can also be manufactured at low cost and has high-performance.

In the above, a method of forming a thin-film, apparatus to form a thin-film, method of manufacturing a semiconductor device, electro-optical unit, and electronic apparatus of the present invention are described. However, the present invention is not limited to the above exemplary embodiments and can be modified within the scope of the present invention.

Figure 16:
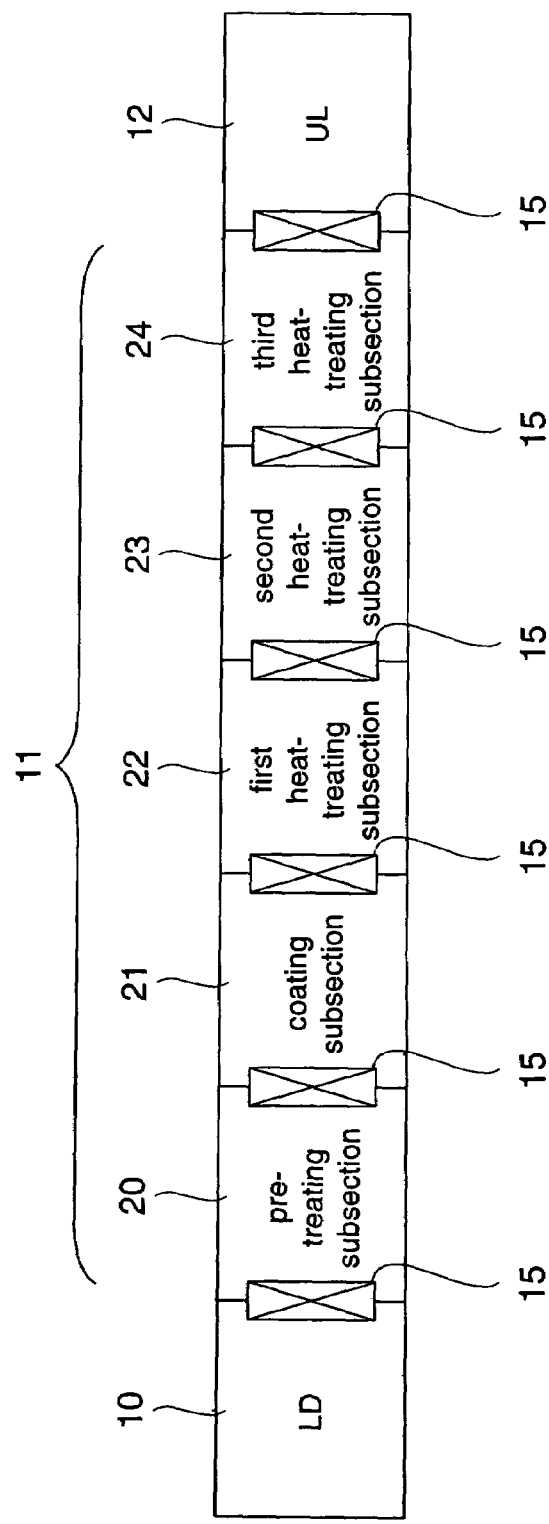
FIG. 16 is a schematic showing a thin-film forming apparatus according to another exemplary embodiment.

For example, the thin-film forming apparatus of the first exemplary embodiment has a configuration in which the treating section 11 is connected to the connecting section 13 as shown in FIG. 1. However, the present invention is not limited to this exemplary embodiment and the following configuration may be used: the treating section 11, the loader 10, and the unloader 12 are directly connected (communicatively connected) to each other, as shown in FIG. 16, without using the connecting section.

The invention claimed is:

1. A method of manufacturing an active matrix substrate, comprising:
depositing a liquid material over a substrate in a first chamber, the first chamber being filled with a first atmosphere, the first atmosphere being different from a room air;
shifting the substrate from the first chamber to a second chamber through a connecting chamber, the connecting chamber connecting the first chamber and the second chamber, the connecting chamber being filled with a second atmosphere, the second atmosphere being different from the room air;
exposing the substrate to a plasma in a third chamber, the third chamber being filled with a fourth atmosphere; and
shifting the substrate from the third chamber to the first chamber through the connecting chamber before the deposition of the liquid material, the connecting chamber connecting the first chamber and the third chamber, the connecting chamber being filled with a fifth atmosphere, the fifth atmosphere being different from the room air.

2. The method of manufacturing an active matrix substrate according to claim 1, the liquid material including a conductive material, a content of oxygen or oxidative gas in the first atmosphere being controlled to 10 ppm or less, and a content of oxygen or oxidative gas in the second atmosphere being controlled to 10 ppm or less.

3. The method of manufacturing an active matrix substrate according to claim 1, the liquid material including a silane compound, a content of oxygen or oxidative gas in the first atmosphere being controlled to 10 ppm or less, and a content of oxygen or oxidative gas in the second atmosphere being controlled to 10 ppm or less.

4. The method of manufacturing an active matrix substrate according to claim 1, the deposition of the liquid material including discharging a droplet of the liquid material from a nozzle of an inkjet head.

5. The method of manufacturing an active matrix according to claim 1, further comprising:
heating the substrate in the second chamber to form a film, the second chamber being filled with a third atmosphere, the third atmosphere being different from the room air.

6. A method of manufacturing a semiconductor device having functional layers, any one of the functional layers being formed by applying a liquid material containing a component of the functional layer onto a substrate, the method comprising:
forming the functional layer by the method according to claim 1.

7. A method of manufacturing an electro-optical unit using the method of manufacturing an active matrix substrate according to claim 1.

8. A method of manufacturing an electronic apparatus using the method of manufacturing an electro-optical unit according to claim 7.

9. A method of manufacturing an active matrix substrate, comprising:
depositing a liquid material over a substrate in a first chamber, the first chamber being filled with a first atmosphere, the first atmosphere being different from a room air;
shifting the substrate from the first chamber to a second chamber through a connecting chamber, the connecting chamber connecting the first chamber and the second chamber, the connecting chamber being filled with a second atmosphere, the second atmosphere being different from the room air;
irradiating the substrate with a light in a third chamber, the third chamber being filled with a fourth atmosphere; and
shifting the substrate from the third chamber to the first chamber through the connecting chamber before the deposition of the liquid material, the connecting chamber connecting the first chamber and the third chamber, the connecting chamber being filled with a fifth atmosphere, the fifth atmosphere being different from the room air.

10. The method of manufacturing an active matrix according to claim 9, further comprising:
heating the substrate in the second chamber to form a film, the second chamber being filled with a third atmosphere, the third atmosphere being different from the room air.

11. A method of manufacturing an active matrix substrate, comprising:

depositing a liquid material over a substrate in a first chamber, the first chamber being filled with a first atmosphere, the first atmosphere being different from a room air;

shifting the substrate from the first chamber to a second chamber through a connecting chamber, the connecting chamber connecting the first chamber and the second chamber, the connecting chamber being filled with a second atmosphere, the second atmosphere being different from the room air;

heating the substrate in the second chamber to form a film, the second chamber being filled with a third atmosphere, the third atmosphere being different from the room air;

shifting the substrate from the second chamber to a fourth chamber through the connecting chamber after the heating of the substrate, the connecting chamber connecting the second chamber and the fourth chamber, the connecting chamber being filled with a sixth atmosphere, the sixth atmosphere being different from the room air; and irradiating the film with a light in the fourth chamber, the fourth chamber being filled with a seventh atmosphere, the seventh atmosphere being different from a room air.

* * * * *